(12) United States Patent
Petter

(10) Patent No.: US 12,235,301 B2
(45) Date of Patent: Feb. 25, 2025

(54) METHODS AND SYSTEMS FOR ELECTRIC PROPULSOR FAULT DETECTION

(71) Applicant: BETA AIR LLC, South Burlington, VT (US)

(72) Inventor: Jeffrey K. Petter, Williston, VT (US)

(73) Assignee: BETA AIR LLC, South Burlington, VT (US)

( * ) Notice: Subject to any disclaimer, the term of this patent is extended or adjusted under 35 U.S.C. 154(b) by 0 days.

(21) Appl. No.: 18/139,601

(22) Filed: Apr. 26, 2023

(65) Prior Publication Data

US 2023/0314493 A1    Oct. 5, 2023

Related U.S. Application Data

(63) Continuation of application No. 17/740,984, filed on May 10, 2022, now Pat. No. 11,686,751, which is a continuation-in-part of application No. 17/366,449, filed on Jul. 2, 2021, now Pat. No. 11,353,511.

(51) Int. Cl.
| | |
|---|---|
| *G01R 23/165* | (2006.01) |
| *B60L 3/00* | (2019.01) |
| *B64C 29/00* | (2006.01) |
| *B64D 27/24* | (2024.01) |
| *B64D 35/04* | (2006.01) |

(Continued)

(52) U.S. Cl.
CPC ............ *G01R 23/165* (2013.01); *B60L 3/003* (2013.01); *B64C 29/0008* (2013.01); *B64D 27/24* (2013.01); *B64D 35/04* (2013.01); *G01R 31/008* (2013.01); *G01R 31/343* (2013.01); *B60L 2200/10* (2013.01)

(58) Field of Classification Search
None
See application file for complete search history.

(56) References Cited

U.S. PATENT DOCUMENTS

| | | |
|---|---|---|
| 4,054,881 A | 10/1977 | Raab |
| 4,360,888 A | 11/1982 | Onksen et al. |
| 8,030,788 B2 | 10/2011 | Xu et al. |

(Continued)

FOREIGN PATENT DOCUMENTS

| | | |
|---|---|---|
| CN | 112623252 | 4/2021 |
| CN | 112623252 H | 4/2021 |

OTHER PUBLICATIONS

Revol et al., Overview and new trends in technology bricks for reliability enhancement in future wide band gap power converters for More Electrical Aircraft (MEA) and More Electrical Propulsion (MEP) systems, Dec. 19, 2019.

(Continued)

*Primary Examiner* — Farhana A Hoque
(74) *Attorney, Agent, or Firm* — Brake Hughes Bellermann LLP

(57) ABSTRACT

Systems and methods relate to electric propulsor fault detection. An exemplary system includes at least a first inverter configured to accept a direct current and produce an alternating current, a first propulsor, a first motor operatively connected with the first propulsor and powered by the alternating current, and at least a noise monitoring circuit electrically connected with the direct current and configured to detect electromagnetic noise and disengage the at least an inverter as a function of the electromagnetic noise.

18 Claims, 9 Drawing Sheets

(51) Int. Cl.
  *G01R 31/00*  (2006.01)
  *G01R 31/34*  (2020.01)

(56) References Cited

U.S. PATENT DOCUMENTS

| | | |
|---|---|---|
| 10,164,545 B2 | 12/2018 | Jouper |
| 10,926,874 B2 | 2/2021 | Giannini et al. |
| 11,686,751 B2 * | 6/2023 | Petter .................. B64D 35/04 |
| | | 324/765.01 |
| 2020/0177590 A1 * | 6/2020 | Levy .................. H04W 12/10 |
| 2020/0282853 A1 | 9/2020 | Paryani et al. |
| 2021/0070179 A1 | 3/2021 | Wiegman |

OTHER PUBLICATIONS

Dorn-Gomba et al., Power Electronic Converters in Electric Aircraft: Current Status, Challenges, and Emerging Technologies, Jul. 1, 2020.

* cited by examiner

METHODS AND SYSTEMS FOR ELECTRIC PROPULSOR FAULT DETECTION

CROSS-REFERENCE TO RELATED APPLICATIONS

This application is a continuation of Non-provisional application Ser. No. 17/740,984 filed on May 10, 2022, and entitled "METHODS AND SYSTEMS FOR ELECTRIC PROPULSOR FAULT DETECTION," which is a continuation-in-part of Non-provisional application Ser. No. 17/366,449 filed on Jul. 2, 2021, and entitled "METHODS AND SYSTEMS FOR ELECTRIC PROPULSOR FAULT DETECTION," the entirety of each of which are incorporated herein by reference.

FIELD OF THE INVENTION

The present invention generally relates to the field of aircraft navigation and controls. In particular, the present invention is directed to methods and system for electric propulsor fault detection.

BACKGROUND

Presently electric multirotor aircraft have seen impressive advancement. However, commercial air travel is one of the safest modes of human transportation. Electric multirotor aircraft must have a demonstrated track record for safety before the public will benefit from the use of electric multirotor aircraft.

SUMMARY OF THE DISCLOSURE

In an aspect an electric propulsor fault detection system includes at least a first inverter configured to accept a direct current and power a first motor, a first propulsor, wherein the first propulsor is mounted to an electric aircraft and configured to provide thrust, the first motor operatively connected with the first propulsor and at least a noise monitoring circuit electrically connected with the direct current and configured to detect noise having a frequency within a specified range and disengage the at least an inverter as a function of the detected noise.

In another aspect a method of electric propulsor fault detection includes accepting, using at least a first inverter, a direct current, powering, using the at least a first inverter, a first motor operatively connected with a first propulsor, wherein the first propulsor is mounted to an electric aircraft and configured to provide thrust, detecting, using at least a noise monitoring circuit electrically connected with the direct current, noise having a frequency within a specified range, and disengage, using the at least a noise monitoring circuit, the at least an inverter as a function of the detected noise.

These and other aspects and features of non-limiting embodiments of the present invention will become apparent to those skilled in the art upon review of the following description of specific non-limiting embodiments of the invention in conjunction with the accompanying drawings.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

The drawings are not necessarily to scale and may be illustrated by phantom lines, diagrammatic representations and fragmentary views. In certain instances, details that are not necessary for an understanding of the embodiments or that render other details difficult to perceive may have been omitted.

DETAILED DESCRIPTION

At a high level, aspects of the present disclosure are directed to systems and methods for electric propulsor fault detection, for example on an electric aircraft. In an embodiment, electromagnetic noise results from a fault of a propulsor or corresponding motor or inverter. Electromagnetic noise may further disrupt other flight systems, including without limitation flight controllers, actuators, flight components, and/or other propulsors or motors.

Aspects of the present disclosure can be used to detect a fault corresponding with electromagnetic noise. Aspects of the present disclosure can also be used to disconnect (from an electrical energy source) or otherwise disengage a flight component experiencing a detected fault. This is so, at least in part, because, in some case, noise monitoring circuit responsible for detecting a fault may be electrically connected to power lines supplying a faulty flight component and therefore able to detect not only a fault, but which flight component is experiencing the fault. Exemplary embodiments illustrating aspects of the present disclosure are described below in the context of several specific examples.

Figure 1:
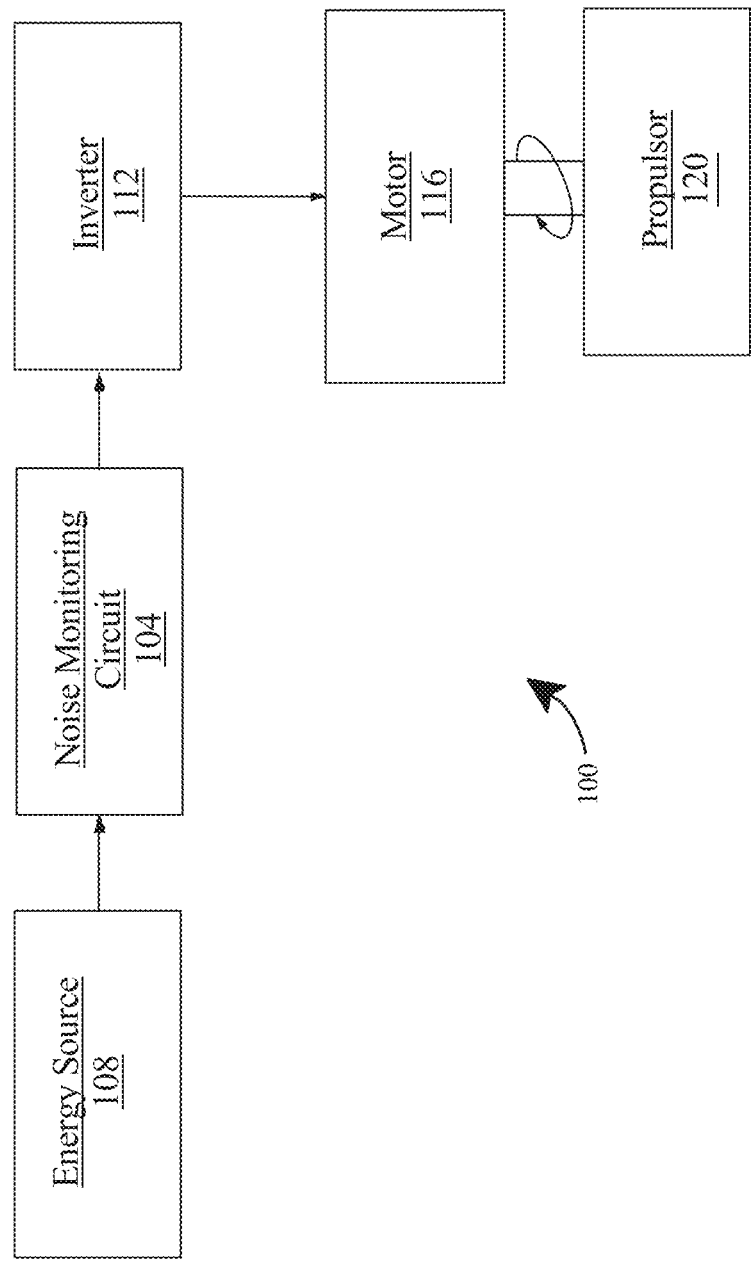
FIG. 1 is a block diagram illustrating an exemplary electric propulsor fault detection system.

Referring now to FIG. 1, an exemplary embodiment of an electric propulsor fault detection system 100 is illustrated. System includes a noise monitoring circuit 104. As used in this disclosure, a "noise monitoring circuit" is an electrical circuit configured to detect electromagnetic noise. As used in this disclosure, "electromagnetic noise" is an electromagnetic and/or radiofrequency disturbance affecting an electric circuit. Electromagnetic noise may include electromagnetic interference and/or radiofrequency interference. Electromagnetic noise may originate from a source external to electric circuit; alternatively or additionally, electromagnetic noise may originate from one or more components within electrical circuit. In some cases, electromagnetic noise may include differential mode current. Alternatively or additionally, in some cases, electromagnetic noise may include common mode current. As used in this disclosure, "common mode current" is a flow of an electric charge having a path that include a common (e.g., ground). In some cases, a common mode current path may include capacitance (e.g., capacitor, air-gap between conductors, and the like) substantially upstream from common. As used in this disclosure, a "differential mode current" is a flow of an electrical charge having a flow path constituting that of an electrical circuit. For example, a differential mode current may include a flow of electrical charge having a flow path than includes a supply conductor and a return conductor of an electrical circuit.

With continued reference to FIG. 1, noise monitoring circuit 104 may include any computing device as described in this disclosure, including without limitation a microcontroller, microprocessor, digital signal processor (DSP) and/or system on a chip (SoC) as described in this disclosure. Computing device may include, be included in, and/or communicate with a mobile device such as a mobile telephone or smartphone. Noise monitoring circuit 104 may include a single computing device operating independently, or may include two or more computing device operating in concert, in parallel, sequentially or the like; two or more computing devices may be included together in a single computing device or in two or more computing devices. Noise monitoring circuit 104 may interface or communicate with one or more additional devices as described below in further detail via a network interface device. Network interface device may be utilized for connecting noise monitoring circuit 104 to one or more of a variety of networks, and one or more devices. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network may employ a wired and/or a wireless mode of communication. In general, any network topology may be used. Information (e.g., data, software etc.) may be communicated to and/or from a computer and/or a computing device. Noise monitoring circuit 104 may include but is not limited to, for example, a computing device or cluster of computing devices in a first location and a second computing device or cluster of computing devices in a second location. Noise monitoring circuit 104 may include one or more computing devices dedicated to data storage, security, distribution of traffic for load balancing, and the like. Noise monitoring circuit 104 may distribute one or more computing tasks as described below across a plurality of computing devices of computing device, which may operate in parallel, in series, redundantly, or in any other manner used for distribution of tasks or memory between computing devices. Noise monitoring circuit 104 may be implemented using a "shared nothing" architecture in which data is cached at the worker, in an embodiment, this may enable scalability of system 100 and/or computing device.

With continued reference to FIG. 1, noise monitoring circuit 104 may be designed and/or configured to perform any method, method step, or sequence of method steps in any embodiment described in this disclosure, in any order and with any degree of repetition. For instance, noise monitoring circuit 104 may be configured to perform a single step or sequence repeatedly until a desired or commanded outcome is achieved; repetition of a step or a sequence of steps may be performed iteratively and/or recursively using outputs of previous repetitions as inputs to subsequent repetitions, aggregating inputs and/or outputs of repetitions to produce an aggregate result, reduction or decrement of one or more variables such as global variables, and/or division of a larger processing task into a set of iteratively addressed smaller processing tasks. Noise monitoring circuit 104 may perform any step or sequence of steps as described in this disclosure in parallel, such as simultaneously and/or substantially simultaneously performing a step two or more times using two or more parallel threads, processor cores, or the like; division of tasks between parallel threads and/or processes may be performed according to any protocol suitable for division of tasks between iterations. Persons skilled in the art, upon reviewing the entirety of this disclosure, will be aware of various ways in which steps, sequences of steps, processing tasks, and/or data may be subdivided, shared, or otherwise dealt with using iteration, recursion, and/or parallel processing. In some cases, noise monitoring circuit 104 may not include a computing device, for example in some cases, the noise monitoring circuit 104 may include a hardwired electrical circuit, for example a circuit as described in reference to FIGS. 2-3.

With continued reference to FIG. 1, system 100 may include an energy source 108. Energy source 108 may include an electrochemical cell, for instance a battery. Energy source 108 may include any battery described in this disclosure, including with reference to FIG. 5. Energy source 108 may be configured to provide a direct current. As used in this disclosure, "direct current" is one directional flow of electric charge. Direct current may be provided by way of one or more electrochemical cells (e.g., batteries). In some cases, noise monitoring circuit 104 may be connected in-line with one or more conductive lines carrying direct current from energy source 108. For example, in some cases, noise monitoring circuit 104 may electrically connected with direct current from energy source 108.

With continued reference to FIG. 1, system 100 may include an inverter 112. An "inverter," as used in this this disclosure, is a power electronic device or circuitry that changes direct current (DC) to alternating current (AC). An inverter (also called a power inverter) may be entirely electronic or may include at least a mechanism (such as a rotary apparatus) and electronic circuitry. In some embodiments, static inverters may not use moving parts in conversion process. Inverters may not produce any power itself; rather, inverters may convert power produced by a DC power source. Inverters may often be used in electrical power applications where high currents and voltages are present; circuits that perform a similar function, as inverters, for electronic signals, having relatively low currents and potentials, may be referred to as oscillators. In some cases, circuits that perform opposite function to an inverter, converting AC to DC, may be referred to as rectifiers. Further description related to inverters and their use with electrical motors used on electric VTOL aircraft is disclosed within U.S. patent application Ser. Nos. 17/144,304 and 17/197,427 entitled "METHODS AND SYSTEMS FOR A FRACTIONAL CONCENTRATED STATOR CONFIGURED FOR USE IN ELECTRIC AIRCRAFT MOTOR" and "SYSTEM AND METHOD FOR FLIGHT CONTROL IN ELECTRIC AIRCRAFT" by C. Lin et al. T. Richter et al., respectively, both of which are incorporated herein by reference in their entirety. Inverter 112 may be configured to accept direct current and produce alternating current. As used in this disclosure, "alternating current" is a flow of electric charge that periodically reverses direction. In some cases, an alternating current may continuously change magnitude overtime; this is in contrast to what may be called a pulsed direct current. Alternatively or additionally, in some cases an alternating current may not continuously vary with time, but instead exhibit a less smooth temporal form. For example, exemplary non-limiting AC waveforms may include a square wave, a triangular wave (i.e., sawtooth), a modifier sine wave, a pulsed sine wave, a pulse width modulated wave, and/or a sine wave. In some cases, noise monitoring circuit may electrically connect to direct current which is provided to inverter 112.

With continued reference to FIG. 1, system 100 may include a motor 116. Motor may include any motor described in this disclosure, including with reference to FIG. 5. Motor 116 may be electrically connected to inverter 112. Motor 116 may be powered by alternating current produced by inverter 112. Motor 116 may be operatively connected with a propulsor 120. Propulsor may include any propulsor described in this disclosure, including with reference to FIG. 5. Motor may operate to move one or more flight control components and/or one or more control surfaces, to drive one or more propulsors, or the like. A motor may be driven by direct current (DC) electric power and may include, without limitation, brushless DC electric motors, switched reluctance motors, induction motors, or any combination thereof. Alternatively or additionally, a motor may be driven by an inverter 112. A motor may also include electronic speed controllers, inverters, or other components for regulating motor speed, rotation direction, and/or dynamic braking.

With continued reference to FIG. 1, noise monitoring circuit 104 may be configured to detect electromagnetic noise and disengage an inverter 112 as a function of the electromagnetic noise. As used in this disclosure, "disengaging" an electrical component, for example, an inverter prevents the function of the electrical component. Non-limiting examples of disengagement of an electrical inverter 112 include disconnecting the inverter 112 from an energy source 108, disconnecting the inverter 112 from a motor 116, or disabling function of the inverter 112. In some cases, an inverter 112 may be disengaged by prevent switching of current within inverter. In some embodiments, noise monitoring circuit 104 may include a filter. As used in this disclosure, a "filter" is a circuit that is configured to selectively block and/or pass certain signals. An exemplary filter is a bandpass filter than selectively blocks and/or passes frequencies within a certain range, i.e., band. In some cases, noise monitoring circuit 104 may include an electromagnetic interference (EMI) filter. As used in this disclosure, an "electromagnetic interference filter" is an electrical circuit or device that mitigates electromagnetic noise present on an electrical conductor or circuit. In some cases, an electromagnetic interference (EMI) filter may be active, passive, or both. As used in this disclosure, an electrical circuit is "passive" when it comprises substantially all passive components. As used in this disclosure, a "passive component" is an electrical component that requires no additional electrical power to operate. Non-limiting examples of passive components include inductors, capacitors, transformers, and resistors. Alternatively, as used in this disclosure, an electrical circuit is "active" when is comprises at least one (necessary) active component. As used in this disclosure, an "active component" is an electrical component that provides and/or switches electrical energy. An active component may require additional electrical power to operate. Non-limiting examples of active electrical components include voltage sources, current sources, transistors, digital controllers, computing devices, and the like.

Still referring to FIG. 1, in some embodiments, noise monitoring circuit 104 may include a noise detection signal connected with EMI filter. As used in this disclosure, a "noise detecting signal" is at least a signal that indicates electromagnetic noise on an electrical circuit. In some cases, noise detection signal may be inductively connected with EMI filter, for example as is described with reference to FIG. 3. Noise detecting signal may include any type of signal. In some cases, noise monitoring circuit 104 may perform one or more signal processing steps on noise detecting signal. For instance, noise monitoring circuit 104 may analyze, modify, and/or synthesize noise detecting signal in order to improve the signal, for instance by improving transmission, storage efficiency, or signal to noise ratio. Exemplary methods of signal processing may include analog, continuous time, discrete, digital, nonlinear, and statistical. Analog signal processing may be performed on non-digitized or analog signals. Exemplary analog processes may include passive filters, active filters, additive mixers, integrators, delay lines, compandors, multipliers, voltage-controlled filters, voltage-controlled oscillators, and phase-locked loops. Continuous-time signal processing may be used, in some cases, to process signals which vary continuously within a domain, for instance time. Exemplary non-limiting continuous time processes may include time domain processing, frequency domain processing (e.g., Fourier transform), and complex frequency domain processing. Discrete time signal processing may be used when a signal is sampled non-continuously or at discrete time intervals (i.e., quantized in time). Analog discrete-time signal processing may process a signal using the following exemplary circuits sample and hold circuits, analog time-division multiplexers, analog delay lines, and analog feedback shift registers. Digital signal processing may be used to process digitized discrete-time sampled signals. Commonly, digital signal processing may be performed by a computing device or other specialized digital circuits, such as without limitation an application specific integrated circuit (ASIC), a field-programmable gate array (FPGA), or a specialized digital signal processor (DSP). Digital signal processing may be used to perform any combination of typical arithmetical operations, including fixed-point, floating-point, real-valued and complex-valued, multiplication and addition. Digital signal processing may additionally operate circular buffers and lookup tables. Further non-limiting examples of algorithms that may be performed according to digital signal processing techniques include fast Fourier transform (FFT), finite impulse response (FIR) filter, infinite impulse response (IIR) filter, and adaptive filters such as the Wiener and Kalman filters. Statistical signal processing may be used to process a signal as a random function (i.e., a stochastic process), utilizing statistical properties. For instance, in some embodiments, a signal may be modeled with a probability distribution indicating noise, which then may be used to reduce noise in a processed signal.

Still referring to FIG. 1, in some embodiments, electromagnetic noise may include a common mode noise; and EMI filter may include a common mode filter. As used in this disclosure, a "common mode noise" is an electromagnetic or radiofrequency disturbance of a common mode current. As used in this disclosure, a "common mode filter" is an electromagnetic filter that acts upon common mode noise.

Still referring to FIG. 1, in some embodiments, electromagnetic noise may include a differential mode noise; and EMI filter may include a differential mode filter. As used in this disclosure, a "differential mode noise" is an electromagnetic or radiofrequency disturbance of a differential mode current. As used in this disclosure, a "differential mode filter" is an electromagnetic filter that acts upon differential mode noise.

Still referring to FIG. 1, in some embodiments, electromagnetic noise may be indicative of fault. As used in this disclosure, a "fault" is an occurrence that is outside of specified bounds. For example, a fault may occur when a motor operates outside of normal specified operating conditions. A fault may also occur when a motor fails to operate at all. Non-limiting examples of faults include motor neutral ground faults, motor phase ground faults, motor winding ground fault, turn to turn fault, inverter DC bus ground fault, battery bus ground fault. In some cases, fault may include a motor fault. As used in this disclosure, a "motor fault" is a fault involving a motor, for example when a motor 116 operates outside a specified boundary. In some cases, fault may include an inverter fault. As used in this disclosure, a "inverter fault" is a fault involving an inverter, for example when an inverter 112 operates outside a specified boundary.

Still referring to FIG. 1, in some embodiments, propulsor 120 may be mounted to an electric aircraft and configured to produce lift. In some cases, electric aircraft may additionally include a second inverter, a second motor powered by the second inverter, a second propulsor operatively connected to the second motor, mounted to the electric aircraft, and configured to produce lift. In some cases, electromagnetic noise may disturb at least one of second inverter, second motor, and second propulsor. Disclosure related to a plurality of inverters and motors is described below with reference to FIG. 2.

Figure 2:
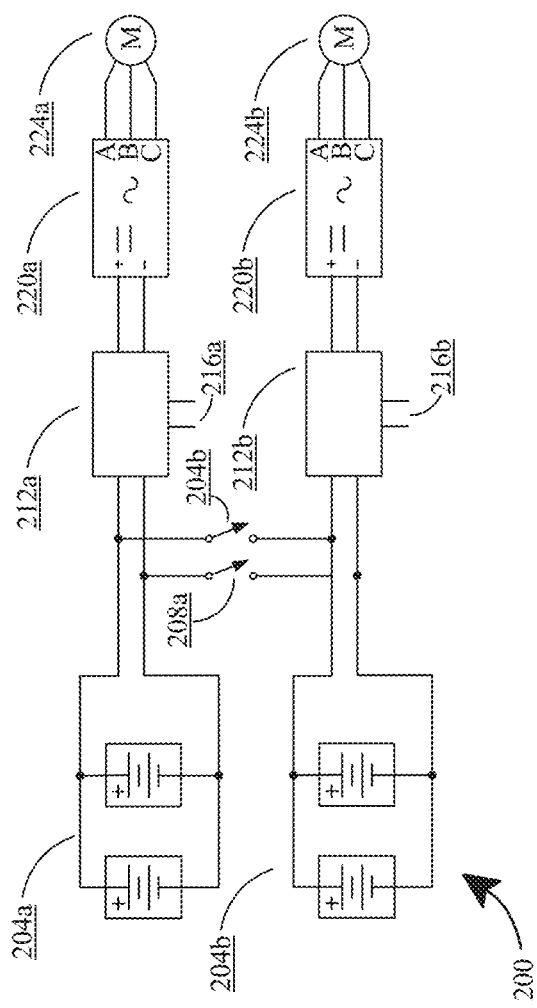
FIG. 2 is a block diagram of exemplary electric propulsor fault detection systems with a plurality of motors.

Referring now to FIG. 2, a schematic is shown comprising a plurality of electrical propulsor fault detection systems 200. From left to right, plurality of systems 200 may include energy sources 204a-b, switches 208a-b, electromagnetic filters 212a-b with connectors carrying noise detecting signals 216a-b, inverters 220a-b, and motors 224a-b. In some embodiments, a fault and resulting electromagnetic noise from one or more of a first motor 224a and/or a first inverter 220a may disrupt performance of one or more of second motor 224b and/or second inverter 220b. Therefore, in some cases, fault may be detected, using a noise monitoring circuit electrically connected to a first noise detecting signal 216a, and presence of the fault may be used to disengage (e.g., disconnect power to) first inverter 220a, for example by way of one or switches 208a-b. Alternatively or additionally, in some cases, first inverter 220a may be disengaged without being disconnected. In some cases, first inverter 220a may switch current internally in order to produce alternating current; and first inverter 220a may be disengaged internally by disabling switching of current within first inverter 220a. In some cases, first inverter 220a may be disengaged by disconnecting alternating current from first inverter 220a to first motor 224a or otherwise removing an electrical load from the first inverter 220a. In some cases, a switch and/or relay may be used to selectively disconnect power to one or more inverters 220a-b. Exemplary non-limiting relays include coaxial relays, contactor relays, force-guided contacts relay, latching relays, machine tool relays, mercury relays, mercury-wetted relays, multi-voltage relays, overload protection relays, polarized relays, Reed relays, safety relays, solid-state contactor relays, solid state relays, static relays time delay relays, vacuum relays, and the like. In some cases, system 100, 200 may be designed and configured to operate (and selectively switch) high-potential, high-current, and/or high-power electricity. For instance in some cases, system 100, 200 may be designed to deliver at least 3 KV of potential from energy sources 204a-b to inverters 220a-b. Motors 224a-b may be operatively coupled and configured to power any flight component, described in this disclosure, including for example propulsors (e.g., lift propulsors).

Figure 3:
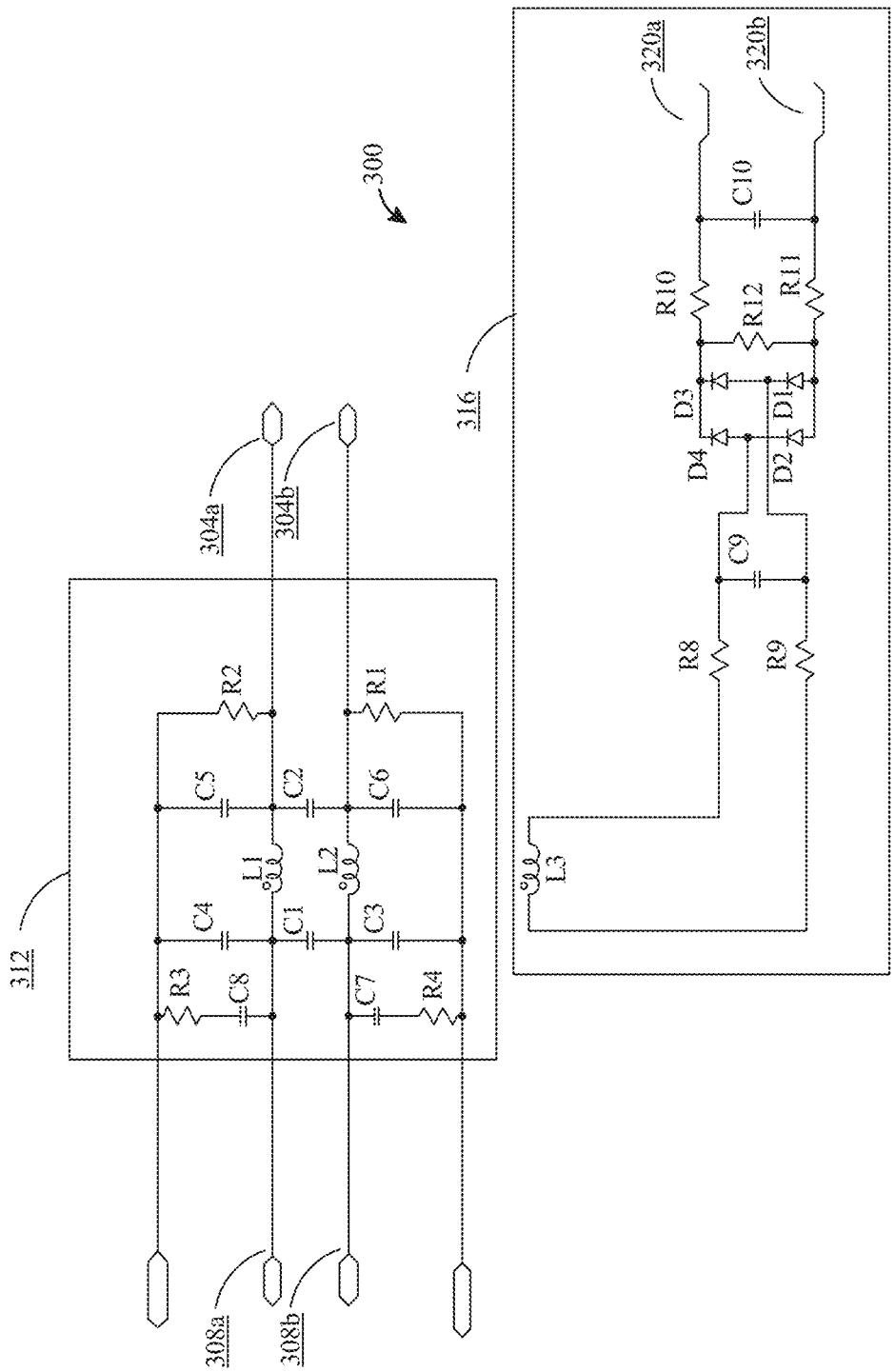
FIG. 3 is a schematic of an exemplary electric propulsor fault detection system.

Referring now to FIG. 3, a schematic illustrates an exemplary noise monitoring circuit 300. In some embodiments, noise monitoring circuit 300 may be located on a direct current side of an inverter, for example as described above in reference to FIGS. 1-2. Direct current power lines are illustrated within circuit 300 running right to left with inputs 304a-b and outputs 308a-b. Circuit 300 may include an electromagnetic interference (EMI) filter 312. EMI filter 312 may include a common mode noise filter and/or a differential mode noise filter. EMI filter 312 may include one or more of resistance-capacitance (RC) circuits, resistance-inductance (RL) circuits, inductance-capacitance (LC) circuits and/or resistance-inductance-capacitance (RLC) circuits, for example as one or more of a common mode noise filter and/or a differential mode noise filter. Exemplary EMI filter 312 schematically illustrated in FIG. 3, may have passive electrical component parameters according to table below:

| Component | Parameter |
| --- | --- |
| Resistor 1, 2 (R1, R2) | 10 KOhm |
| Resistor 3, 4 (R3, R4) | 10 Ohm |
| Capacitor 1 (C1) | 500 nF |
| Capacitor 2, 3, 4 (C2, C3, C4) | 50 nF |
| Capacitor 5, 6, (C5, C6) | 5 nF |
| Capacitor 7, 8 (C7, C8) | 200 nF |
| Inductor 1, 2 (L1, L2) | 10 µH |

Still referring to FIG. 3, in some embodiments EMI filter 312 may be used to selectively block and/or pass electromagnetic noise having certain frequencies. For example, an EMI filter that includes an LC filter may have a cutoff frequency approximately equal to:

$$f_c = \frac{1}{2\pi\sqrt{LC}}$$

where, $f_c$ is cutoff frequency (e.g., in Hertz), L is inductance (e.g., in Henry), and C is capacitance (e.g., in Farad). In some embodiments, impedance of EMI filter 312 may be considered. For instance, in order to avoid instability, such as without limitation Middlebrook instability, impedance of EMI filter 312 may need to be much lower than impedance of other components within circuit, such as without limitation energy sources. In some embodiments, impedance of an LC circuit may be estimated thus:

$$Z_f = \sqrt{\frac{L}{C}}$$

where, $Z_F$ is impedance of LC circuit.

With continued reference to FIG. 3, in some embodiments, noise monitoring circuit 300 may include a sub-circuit 316 for detecting a noise detecting signal. Sub-circuit 316 may be inductively coupled to EMI filter 312, thereby allowing electromagnetic noise to be communicated with the sub-circuit 316. In some cases, sub-circuit may perform one or more signal processing or signal analyzing functions on noise detecting signal. For example, sub-circuit 316 may perform any signal processing and/or signal analysis functions described in this disclosure. In some cases, sub-circuit 316 may be connected, for instance by way of one or more monitoring outputs 320 a-b, to a computing device. For instance, monitoring outputs 320 a-b may connect a noise detecting signal to digital to analog converter, which may digitize the noise detecting signal, thereby allowing a computing device to digitally analyze and/or process the noise detecting signal using digital methods. In some cases, computing device may selectively switch power to one or more inverters as a function of noise detecting signal.

Figure 4:
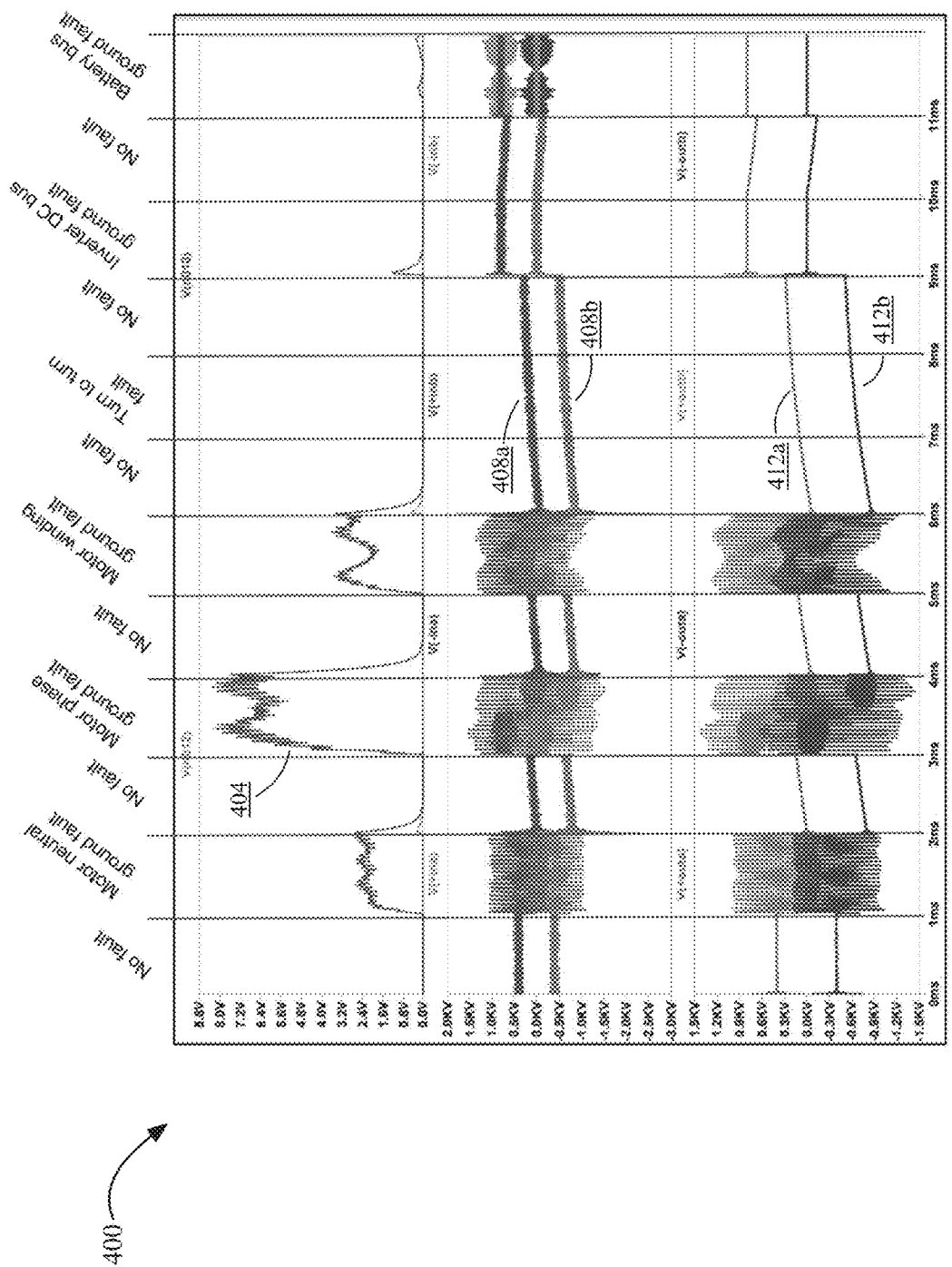
FIG. 4 is a graph illustrating exemplary electromagnetic noises.

Referring now to FIG. 4, an exemplary composite graph 400 is shown that illustrates voltages over time for a number of representative faults. A signal trace 404 represents an exemplary noise detecting signal. signal trace 404 is illustrated with potential in volts along a vertical axis and time in milliseconds along a horizontal axis. Input potential is illustrated by a positive input trace 408 a and a negative input trace 408 b. Output potential is illustrated by a positive output potential 412 a and a negative output potential 412 b. Both input traces 408 a-b and output potential 412 a-b are illustrated in graph 400 with potential in kilovolts represented along a vertical axis and time in milliseconds represented along a horizontal axis. Along horizontal (time) axis a number of faults have been demonstrated. From graph 400, it can be seen that faults can cause disruption to supply direct current, through large vacillations of input traces 408 a-b and output potential 412 a-b. This disruption to direct current, if allowed to persist may disrupt other electronic components, such as without limitation electric propulsors. It can also be seen from graph 400 that faults may be detected through regular excursions of signal trace 404. In some embodiments, system may perform analysis on signal trace, including but not limited to amplitude thresholding, integrating, averaging, summing, and the like, to determine presence and/or type of fault present. In some cases, system may selectively disconnect at least an inverter from direct current as a result of analysis of signal trace.

Figure 5:
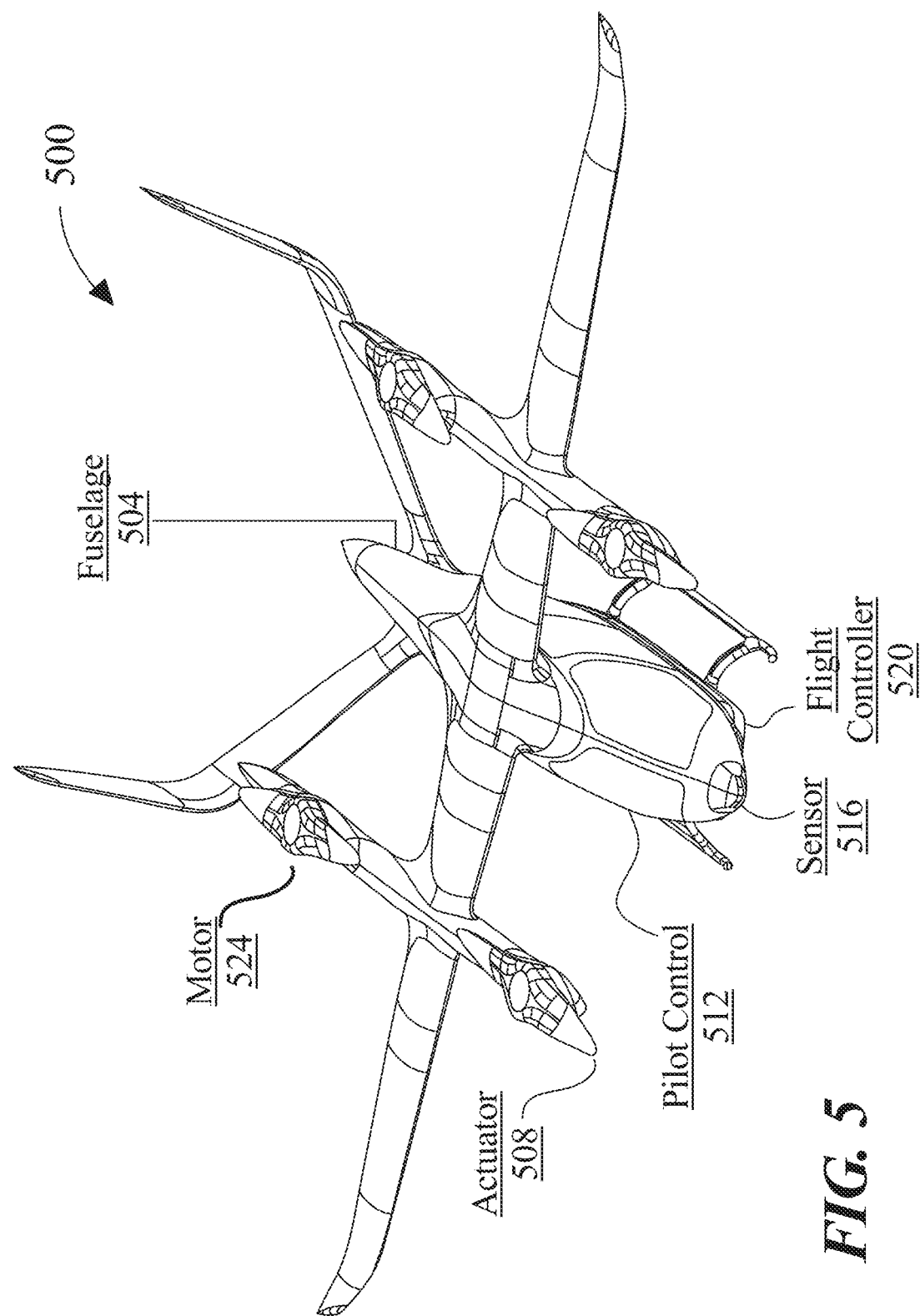
FIG. 5 is an illustration of an exemplary electric aircraft.

Referring now to FIG. 5, an exemplary embodiment of an aircraft 500 is illustrated. Aircraft 500 may include an electrically powered aircraft (i.e., electric aircraft). In some embodiments, electrically powered aircraft may be an electric vertical takeoff and landing (eVTOL) aircraft. Electric aircraft may be capable of rotor-based cruising flight, rotor-based takeoff, rotor-based landing, fixed-wing cruising flight, airplane-style takeoff, airplane-style landing, and/or any combination thereof. "Rotor-based flight," as described in this disclosure, is where the aircraft generated lift and propulsion by way of one or more powered rotors coupled with an engine, such as a quadcopter, multi-rotor helicopter, or other vehicle that maintains its lift primarily using downward thrusting propulsors. "Fixed-wing flight," as described in this disclosure, is where the aircraft is capable of flight using wings and/or foils that generate lift caused by the aircraft's forward airspeed and the shape of the wings and/or foils, such as airplane-style flight.

Still referring to FIG. 5, aircraft 500 may include a fuselage 504. As used in this disclosure a "fuselage" is the main body of an aircraft, or in other words, the entirety of the aircraft except for the cockpit, nose, wings, empennage, nacelles, any and all control surfaces, and generally contains an aircraft's payload. Fuselage 504 may comprise structural elements that physically support the shape and structure of an aircraft. Structural elements may take a plurality of forms, alone or in combination with other types. Structural elements may vary depending on the construction type of aircraft and specifically, the fuselage. Fuselage 504 may comprise a truss structure. A truss structure may be used with a lightweight aircraft and may include welded aluminum tube trusses. A truss, as used herein, is an assembly of beams that create a rigid structure, often in combinations of triangles to create three-dimensional shapes. A truss structure may alternatively comprise titanium construction in place of aluminum tubes, or a combination thereof. In some embodiments, structural elements may comprise aluminum tubes and/or titanium beams. In an embodiment, and without limitation, structural elements may include an aircraft skin. Aircraft skin may be layered over the body shape constructed by trusses. Aircraft skin may comprise a plurality of materials such as aluminum, fiberglass, and/or carbon fiber, the latter of which will be addressed in greater detail later in this paper.

Still referring to FIG. 5, aircraft 500 may include a plurality of actuators 508. An actuator may include any motor and/or propulsor described in this disclosure, for instance in reference to FIGS. 1-4. In an embodiment, an actuator may be mechanically coupled to an aircraft. As used herein, a person of ordinary skill in the art would understand "mechanically coupled" to mean that at least a portion of a device, component, or circuit is connected to at least a portion of the aircraft via a mechanical coupling. Said mechanical coupling can include, for example, rigid coupling, such as beam coupling, bellows coupling, bushed pin coupling, constant velocity, split-muff coupling, diaphragm coupling, disc coupling, donut coupling, elastic coupling, flexible coupling, fluid coupling, gear coupling, grid coupling, Hirth joints, hydrodynamic coupling, jaw coupling, magnetic coupling, Oldham coupling, sleeve coupling, tapered shaft lock, twin spring coupling, rag joint coupling, universal joints, or any combination thereof. As used in this disclosure an "aircraft" is vehicle that may fly. As a non-limiting example, aircraft may include airplanes, helicopters, airships, blimps, gliders, paramotors, and the like thereof. In an embodiment, mechanical coupling may be used to connect the ends of adjacent parts and/or objects of an electric aircraft. Further, in an embodiment, mechanical coupling may be used to join two pieces of rotating electric aircraft components.

With continued reference to FIG. 5, a plurality of actuators 508 may be configured to produce a torque. As used in this disclosure a "torque" is a measure of force that causes an object to rotate about an axis in a direction. For example, and without limitation, torque may rotate an aileron and/or rudder to generate a force that may adjust and/or affect altitude, airspeed velocity, groundspeed velocity, direction during flight, and/or thrust. For example, plurality of actuators 508 may include a component used to produce a torque that affects aircrafts' roll and pitch, such as without limitation one or more ailerons. An "aileron," as used in this disclosure, is a hinged surface which form part of the trailing edge of a wing in a fixed wing aircraft, and which may be moved via mechanical means such as without limitation servomotors, mechanical linkages, or the like. As a further example, plurality of actuators 508 may include a rudder, which may include, without limitation, a segmented rudder that produces a torque about a vertical axis. Additionally or alternatively, plurality of actuators 508 may include other flight control surfaces such as propulsors, rotating flight controls, or any other structural features which can adjust movement of aircraft 500. Plurality of actuators 508 may include one or more rotors, turbines, ducted fans, paddle wheels, and/or other components configured to propel a vehicle through a fluid medium including, but not limited to air.

Still referring to FIG. 5, plurality of actuators 508 may include at least a propulsor component. As used in this disclosure a "propulsor component" or "propulsor" is a component and/or device used to propel a craft by exerting force on a fluid medium, which may include a gaseous medium such as air or a liquid medium such as water. In an embodiment, when a propulsor twists and pulls air behind it, it may, at the same time, push an aircraft forward with an amount of force and/or thrust. More air pulled behind an aircraft results in greater thrust with which the aircraft is pushed forward. Propulsor component may include any device or component that consumes electrical power on demand to propel an electric aircraft in a direction or other vehicle while on ground or in-flight. In an embodiment, propulsor component may include a puller component. As used in this disclosure a "puller component" is a component that pulls and/or tows an aircraft through a medium. As a non-limiting example, puller component may include a flight component such as a puller propeller, a puller motor, a puller propulsor, and the like. Additionally, or alternatively, puller component may include a plurality of puller flight components. In another embodiment, propulsor component may include a pusher component. As used in this disclosure a "pusher component" is a component that pushes and/or thrusts an aircraft through a medium. As a non-limiting example, pusher component may include a pusher component such as a pusher propeller, a pusher motor, a pusher propulsor, and the like. Additionally, or alternatively, pusher flight component may include a plurality of pusher flight components.

In another embodiment, and still referring to FIG. 5, propulsor may include a propeller, a blade, or any combination of the two. A propeller may function to convert rotary motion from an engine or other power source into a swirling slipstream which may push the propeller forwards or backwards. Propulsor may include a rotating power-driven hub, to which several radial airfoil-section blades may be attached, such that an entire whole assembly rotates about a longitudinal axis. As a non-limiting example, blade pitch of propellers may be fixed at a fixed angle, manually variable to a few set positions, automatically variable (e.g. a "constant-speed" type), and/or any combination thereof as described further in this disclosure. As used in this disclosure a "fixed angle" is an angle that is secured and/or substantially unmovable from an attachment point. For example, and without limitation, a fixed angle may be an angle of 2.2° inward and/or 1.7° forward. As a further non-limiting example, a fixed angle may be an angle of 3.6° outward and/or 2.7° backward. In an embodiment, propellers for an aircraft may be designed to be fixed to their hub at an angle similar to the thread on a screw makes an angle to the shaft; this angle may be referred to as a pitch or pitch angle which may determine a speed of forward movement as the blade rotates. Additionally or alternatively, propulsor component may be configured having a variable pitch angle. As used in this disclosure a "variable pitch angle" is an angle that may be moved and/or rotated. For example, and without limitation, propulsor component may be angled at a first angle of 3.3° inward, wherein propulsor component may be rotated and/or shifted to a second angle of 1.7° outward.

Still referring to FIG. 5, propulsor may include a thrust element which may be integrated into the propulsor. Thrust element may include, without limitation, a device using moving or rotating foils, such as one or more rotors, an airscrew or propeller, a set of airscrews or propellers such as contra-rotating propellers, a moving or flapping wing, or the like. Further, a thrust element, for example, can include without limitation a marine propeller or screw, an impeller, a turbine, a pump-jet, a paddle or paddle-based device, or the like.

With continued reference to FIG. 5, plurality of actuators 508 may include power sources, control links to one or more elements, fuses, and/or mechanical couplings used to drive and/or control any other flight component.

Still referring to FIG. 5, plurality of actuators 508 may include an energy source. An energy source may include, for example, a generator, a photovoltaic device, a fuel cell such as a hydrogen fuel cell, direct methanol fuel cell, and/or solid oxide fuel cell, an electric energy storage device (e.g. a capacitor, an inductor, and/or a battery). An energy source may also include a battery cell, or a plurality of battery cells connected in series into a module and each module connected in series or in parallel with other modules. Configuration of an energy source containing connected modules may be designed to meet an energy or power requirement and may be designed to fit within a designated footprint in an electric aircraft in which system may be incorporated.

In an embodiment, and still referring to FIG. 5, an energy source may be used to provide a steady supply of electrical power to a load over a flight by an electric aircraft 500. For example, energy source may be capable of providing sufficient power for "cruising" and other relatively low-energy phases of flight. An energy source may also be capable of providing electrical power for some higher-power phases of flight as well, particularly when the energy source is at a high SOC, as may be the case for instance during takeoff. In an embodiment, energy source may include an emergency power unit which may be capable of providing sufficient electrical power for auxiliary loads including without limitation, lighting, navigation, communications, de-icing, steering or other systems requiring power or energy. Further, energy source may be capable of providing sufficient power for controlled descent and landing protocols, including, without limitation, hovering descent or runway landing. As used herein the energy source may have high power density where electrical power an energy source can usefully produce per unit of volume and/or mass is relatively high. As used in this disclosure, "electrical power" is a rate of electrical energy per unit time. An energy source may include a device for which power that may be produced per unit of volume and/or mass has been optimized, for instance at an expense of maximal total specific energy density or power capacity. Non-limiting examples of items that may be used as at least an energy source include batteries used for starting applications including Li ion batteries which may include NCA, NMC, Lithium iron phosphate (LiFePO4) and Lithium Manganese Oxide (LMO) batteries, which may be mixed with another cathode chemistry to provide more specific power if the application requires Li metal batteries, which have a lithium metal anode that provides high power on demand, Li ion batteries that have a silicon or titanite anode, energy source may be used, in an embodiment, to provide electrical power to an electric aircraft or drone, such as an electric aircraft vehicle, during moments requiring high rates of power output, including without limitation takeoff, landing, thermal de-icing and situations requiring greater power output for reasons of stability, such as high turbulence situations, as described in further detail below. A battery may include, without limitation a battery using nickel based chemistries such as nickel cadmium or nickel metal hydride, a battery using lithium ion battery chemistries such as a nickel cobalt aluminum (NCA), nickel manganese cobalt (NMC), lithium iron phosphate (LiFePO4), lithium cobalt oxide (LCO), and/or lithium manganese oxide (LMO), a battery using lithium polymer technology, lead-based batteries such as without limitation lead acid batteries, metal-air batteries, or any other suitable battery. Persons skilled in the art, upon reviewing the entirety of this disclosure, will be aware of various devices of components that may be used as an energy source.

Still referring to FIG. 5, an energy source may include a plurality of energy sources, referred to herein as a module of energy sources. Module may include batteries connected in parallel or in series or a plurality of modules connected either in series or in parallel designed to satisfy both power and energy requirements. Connecting batteries in series may increase a potential of at least an energy source which may provide more power on demand. High potential batteries may require cell matching when high peak load is needed. As more cells are connected in strings, there may exist a possibility of one cell failing which may increase resistance in module and reduce overall power output as voltage of the module may decrease as a result of that failing cell. Connecting batteries in parallel may increase total current capacity by decreasing total resistance, and it also may increase overall amp-hour capacity. Overall energy and power outputs of at least an energy source may be based on individual battery cell performance or an extrapolation based on a measurement of at least an electrical parameter. In an embodiment where energy source includes a plurality of battery cells, overall power output capacity may be dependent on electrical parameters of each individual cell. If one cell experiences high self-discharge during demand, power drawn from at least an energy source may be decreased to avoid damage to a weakest cell. Energy source may further include, without limitation, wiring, conduit, housing, cooling system and battery management system. Persons skilled in the art will be aware, after reviewing the entirety of this disclosure, of many different components of an energy source. Exemplary energy sources are disclosed in detail in U.S. patent application Ser. Nos. 16/948,157 and 16/048,140 both entitled "SYSTEM AND METHOD FOR HIGH ENERGY DENSITY BATTERY MODULE" by S. Donovan et al., which are incorporated in their entirety herein by reference.

Still referring to FIG. 5, according to some embodiments, an energy source may include an emergency power unit (EPU) (i.e., auxiliary power unit). As used in this disclosure an "emergency power unit" is an energy source as described herein that is configured to power an essential system for a critical function in an emergency, for instance without limitation when another energy source has failed, is depleted, or is otherwise unavailable. Exemplary non-limiting essential systems include navigation systems, such as MFD, GPS, VOR receiver or directional gyro, and other essential flight components, such as propulsors.

Still referring to FIG. 5, another exemplary actuator may include landing gear. Landing gear may be used for take-off and/or landing/Landing gear may be used to contact ground while aircraft 500 is not in flight. Exemplary landing gear is disclosed in detail in U.S. patent application Ser. No. 17/196,719 entitled "SYSTEM FOR ROLLING LANDING GEAR" by R. Griffin et al., which is incorporated in its entirety herein by reference.

Still referring to FIG. 5, aircraft 500 may include a pilot control 512, including without limitation, a hover control, a thrust control, an inceptor stick, a cyclic, and/or a collective control. As used in this disclosure a "collective control" or "collective" is a mechanical control of an aircraft that allows a pilot to adjust and/or control the pitch angle of the plurality of actuators 508. For example and without limitation, collective control may alter and/or adjust the pitch angle of all of the main rotor blades collectively. For example, and without limitation pilot control 512 may include a yoke control. As used in this disclosure a "yoke control" is a mechanical control of an aircraft to control the pitch and/or roll. For example and without limitation, yoke control may alter and/or adjust the roll angle of aircraft 500 as a function of controlling and/or maneuvering ailerons. In an embodiment, pilot control 512 may include one or more footbrakes, control sticks, pedals, throttle levels, and the like thereof. In another embodiment, and without limitation, pilot control 512 may be configured to control a principal axis of the aircraft. As used in this disclosure a "principal axis" is an axis in a body representing one three dimensional orientations. For example, and without limitation, principal axis or more yaw, pitch, and/or roll axis. Principal axis may include a yaw axis. As used in this disclosure a "yaw axis" is an axis that is directed towards the bottom of the aircraft, perpendicular to the wings. For example, and without limitation, a positive yawing motion may include adjusting and/or shifting the nose of aircraft 500 to the right. Principal axis may include a pitch axis. As used in this disclosure a "pitch axis" is an axis that is directed towards the right laterally extending wing of the aircraft. For example, and without limitation, a positive pitching motion may include adjusting and/or shifting the nose of aircraft 500 upwards. Principal axis may include a roll axis. As used in this disclosure a "roll axis" is an axis that is directed longitudinally towards the nose of the aircraft, parallel to the fuselage. For example, and without limitation, a positive rolling motion may include lifting the left and lowering the right wing concurrently.

Still referring to FIG. 5, pilot control 512 may be configured to modify a variable pitch angle. For example, and without limitation, pilot control 512 may adjust one or more angles of attack of a propeller. As used in this disclosure an "angle of attack" is an angle between the chord of the propeller and the relative wind. For example, and without limitation angle of attack may include a propeller blade angled 3.2°. In an embodiment, pilot control 512 may modify the variable pitch angle from a first angle of 2.71° to a second angle of 3.82°. Additionally or alternatively, pilot control 512 may be configured to translate a pilot desired torque for the flight component. For example, and without limitation, pilot control 512 may translate that a pilot's desired torque for a propeller be 160 lb. ft. of torque. As a further non-limiting example, pilot control 512 may introduce a pilot's desired torque for a propulsor to be 290 lb. ft. of torque. Additional disclosure related to pilot control 512 may be found in U.S. patent application Ser. Nos. 17/001,845 and 16/929,206 both of which are entitled "A HOVER AND THRUST CONTROL ASSEMBLY FOR DUAL-MODE AIRCRAFT" by C. Spiegel et al., which are incorporated in their entirety herein by reference.

Still referring to FIG. 5, aircraft 500 may include a loading system. A loading system may include a system configured to load an aircraft of either cargo or personnel. For instance, some exemplary loading systems may include a swing nose, which is configured to swing the nose of aircraft 500 of the way thereby allowing direct access to a cargo bay located behind the nose. A notable exemplary swing nose aircraft is Boeing 747. Additional disclosure related to loading systems can be found in U.S. patent application Ser. No. 17/137,594 entitled "SYSTEM AND METHOD FOR LOADING AND SECURING PAYLOAD IN AN AIRCRAFT" by R. Griffin et al., entirety of which in incorporated herein by reference.

Still referring to FIG. 5, aircraft 500 may include a sensor 516. Sensor 516 may include any sensor or noise monitoring circuit described in this disclosure, for instance in reference to FIGS. 1-4. Sensor 516 may be configured to sense a characteristic of pilot control 512. Sensor may be a device, module, and/or subsystem, utilizing any hardware, software, and/or any combination thereof to sense a characteristic and/or changes thereof, in an instant environment, for instance without limitation a pilot control 512, which the sensor is proximal to or otherwise in a sensed communication with, and transmit information associated with the characteristic, for instance without limitation digitized data. Sensor 516 may be mechanically and/or communicatively coupled to aircraft 500, including, for instance, to at least a pilot control 512. Sensor 516 may be configured to sense a characteristic associated with at least a pilot control 512. An environmental sensor may include without limitation one or more sensors used to detect ambient temperature, barometric pressure, and/or air velocity, one or more motion sensors which may include without limitation gyroscopes, accelerometers, inertial measurement unit (IMU), and/or magnetic sensors, one or more humidity sensors, one or more oxygen sensors, or the like. Additionally or alternatively, sensor 516 may include at least a geospatial sensor. Sensor 516 may be located inside an aircraft; and/or be included in and/or attached to at least a portion of the aircraft. Sensor may include one or more proximity sensors, displacement sensors, vibration sensors, and the like thereof. Sensor may be used to monitor the status of aircraft 500 for both critical and non-critical functions. Sensor may be incorporated into vehicle or aircraft or be remote.

Still referring to FIG. 5, in some embodiments, sensor 516 may be configured to sense a characteristic associated with any pilot control described in this disclosure. Non-limiting examples of a sensor 516 may include an inertial measurement unit (IMU), an accelerometer, a gyroscope, a proximity sensor, a pressure sensor, a light sensor, a pitot tube, an air speed sensor, a position sensor, a speed sensor, a switch, a thermometer, a strain gauge, an acoustic sensor, and an electrical sensor. In some cases, sensor 516 may sense a characteristic as an analog measurement, for instance, yielding a continuously variable electrical potential indicative of the sensed characteristic. In these cases, sensor 516 may additionally comprise an analog to digital converter (ADC) as well as any additionally circuitry, such as without limitation a Whetstone bridge, an amplifier, a filter, and the like. For instance, in some cases, sensor 516 may comprise a strain gage configured to determine loading of one or flight components, for instance landing gear. Strain gage may be included within a circuit comprising a Whetstone bridge, an amplified, and a bandpass filter to provide an analog strain measurement signal having a high signal to noise ratio, which characterizes strain on a landing gear member. An ADC may then digitize analog signal produces a digital signal that can then be transmitted other systems within aircraft 500, for instance without limitation a computing system, a pilot display, and a memory component. Alternatively or additionally, sensor 516 may sense a characteristic of a pilot control 512 digitally. For instance in some embodiments, sensor 516 may sense a characteristic through a digital means or digitize a sensed signal natively. In some cases, for example, sensor 516 may include a rotational encoder and be configured to sense a rotational position of a pilot control; in this case, the rotational encoder digitally may sense rotational "clicks" by any known method, such as without limitation magnetically, optically, and the like.

Still referring to FIG. 5, electric aircraft 500 may include at least a motor 524, which may be mounted on a structural feature of the aircraft. Design of motor 524 may enable it to be installed external to structural member (such as a boom, nacelle, or fuselage) for easy maintenance access and to minimize accessibility requirements for the structure; this may improve structural efficiency by requiring fewer large holes in the mounting area. In some embodiments, motor 524 may include two main holes in top and bottom of mounting area to access bearing cartridge. Further, a structural feature may include a component of electric aircraft 500. For example, and without limitation structural feature may be any portion of a vehicle incorporating motor 524, including any vehicle as described in this disclosure. As a further non-limiting example, a structural feature may include without limitation a wing, a spar, an outrigger, a fuselage, or any portion thereof; persons skilled in the art, upon reviewing the entirety of this disclosure, will be aware of many possible features that may function as at least a structural feature. At least a structural feature may be constructed of any suitable material or combination of materials, including without limitation metal such as aluminum, titanium, steel, or the like, polymer materials or composites, fiberglass, carbon fiber, wood, or any other suitable material. As a non-limiting example, at least a structural feature may be constructed from additively manufactured polymer material with a carbon fiber exterior; aluminum parts or other elements may be enclosed for structural strength, or for purposes of supporting, for instance, vibration, torque or shear stresses imposed by at least the propulsor. Persons skilled in the art, upon reviewing the entirety of this disclosure, will be aware of various materials, combinations of materials, and/or constructions techniques.

Still referring to FIG. 5, electric aircraft 500 may include a vertical takeoff and landing aircraft (eVTOL). As used herein, a vertical take-off and landing (eVTOL) aircraft is one that can hover, take off, and land vertically. An eVTOL, as used herein, is an electrically powered aircraft typically using an energy source, of a plurality of energy sources to power the aircraft. In order to optimize the power and energy necessary to propel the aircraft. eVTOL may be capable of rotor-based cruising flight, rotor-based takeoff, rotor-based landing, fixed-wing cruising flight, airplane-style takeoff, airplane-style landing, and/or any combination thereof. Rotor-based flight, as described herein, is where the aircraft generated lift and propulsion by way of one or more powered rotors coupled with an engine, such as a "quad copter," multi-rotor helicopter, or other vehicle that maintains its lift primarily using downward thrusting propulsors. Fixed-wing flight, as described herein, is where the aircraft is capable of flight using wings and/or foils that generate life caused by the aircraft's forward airspeed and the shape of the wings and/or foils, such as airplane-style flight.

With continued reference to FIG. 5, a number of aerodynamic forces may act upon the electric aircraft 500 during flight. Forces acting on electric aircraft 500 during flight may include, without limitation, thrust, the forward force produced by the rotating element of the electric aircraft 500 and acts parallel to the longitudinal axis. Another force acting upon electric aircraft 500 may be, without limitation, drag, which may be defined as a rearward retarding force which is caused by disruption of airflow by any protruding surface of the electric aircraft 500 such as, without limitation, the wing, rotor, and fuselage. Drag may oppose thrust and acts rearward parallel to the relative wind. A further force acting upon electric aircraft 500 may include, without limitation, weight, which may include a combined load of the electric aircraft 500 itself, crew, baggage, and/or fuel. Weight may pull electric aircraft 500 downward due to the force of gravity. An additional force acting on electric aircraft 500 may include, without limitation, lift, which may act to oppose the downward force of weight and may be produced by the dynamic effect of air acting on the airfoil and/or downward thrust from the propulsor 508 of the electric aircraft. Lift generated by the airfoil may depend on speed of airflow, density of air, total area of an airfoil and/or segment thereof, and/or an angle of attack between air and the airfoil. For example, and without limitation, electric aircraft 500 are designed to be as lightweight as possible. Reducing the weight of the aircraft and designing to reduce the number of components is essential to optimize the weight. To save energy, it may be useful to reduce weight of components of electric aircraft 500, including without limitation propulsors and/or propulsion assemblies. In an embodiment, motor 524 may eliminate need for many external structural features that otherwise might be needed to join one component to another component. Motor 524 may also increase energy efficiency by enabling a lower physical propulsor profile, reducing drag and/or wind resistance. This may also increase durability by lessening the extent to which drag and/or wind resistance add to forces acting on electric aircraft 500 and/or propulsors.

Figure 6:
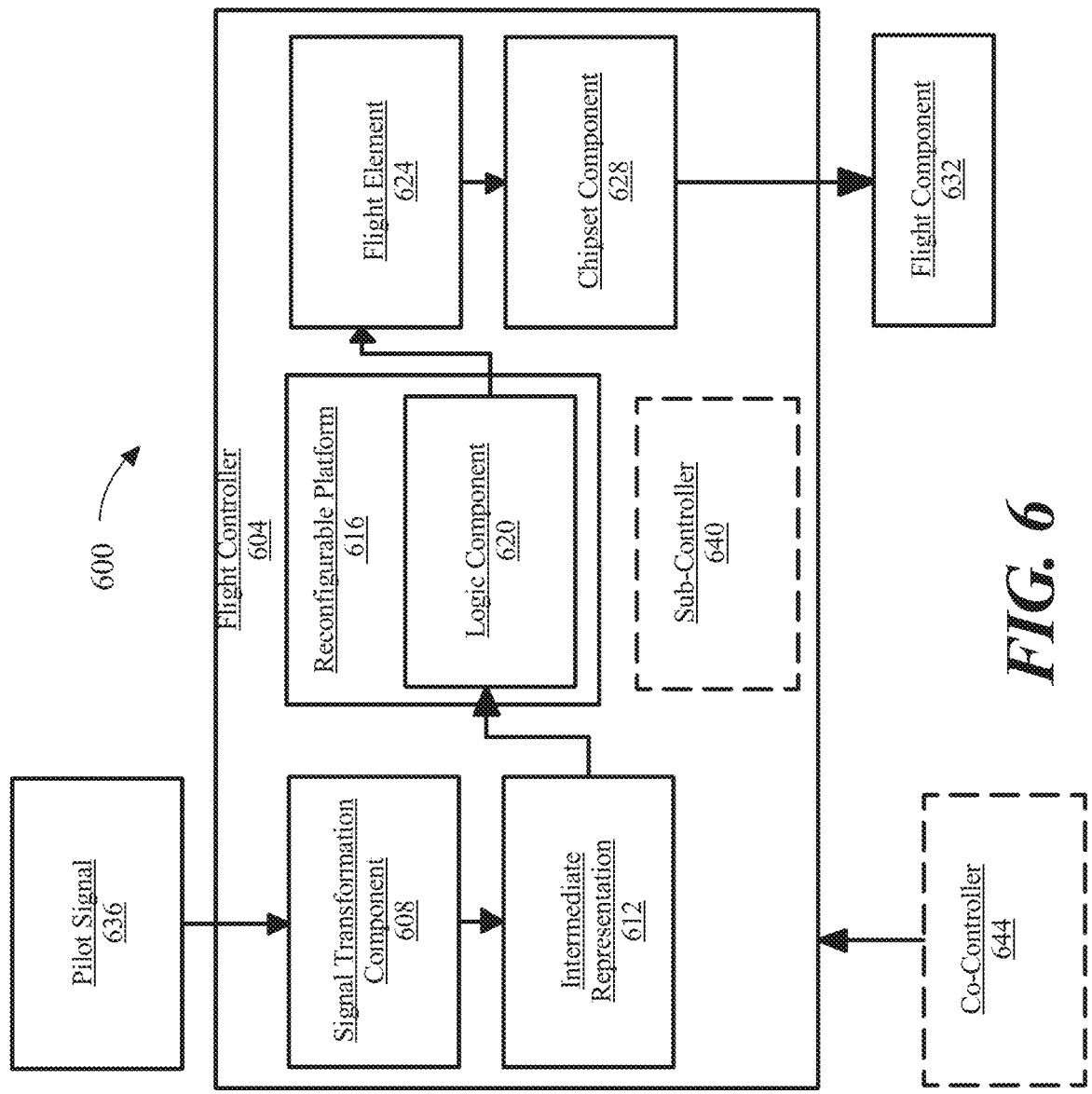
FIG. 6 is a block diagram of an exemplary flight controller.

Now referring to FIG. 6, an exemplary embodiment 600 of a flight controller 604 is illustrated. As used in this disclosure a "flight controller" is a computing device of a plurality of computing devices dedicated to data storage, security, distribution of traffic for load balancing, and flight instruction. Flight controller 604 may include and/or communicate with any computing device as described in this disclosure, including without limitation a microcontroller, microprocessor, digital signal processor (DSP) and/or system on a chip (SoC) as described in this disclosure. Further, flight controller 604 may include a single computing device operating independently, or may include two or more computing device operating in concert, in parallel, sequentially or the like; two or more computing devices may be included together in a single computing device or in two or more computing devices. In embodiments, flight controller 604 may be installed in an aircraft, may control the aircraft remotely, and/or may include an element installed in the aircraft and a remote element in communication therewith.

In an embodiment, and still referring to FIG. 6, flight controller 604 may include a signal transformation component 608. As used in this disclosure a "signal transformation component" is a component that transforms and/or converts a first signal to a second signal, wherein a signal may include one or more digital and/or analog signals. For example, and without limitation, signal transformation component 608 may be configured to perform one or more operations such as preprocessing, lexical analysis, parsing, semantic analysis, and the like thereof. In an embodiment, and without limitation, signal transformation component 608 may include one or more analog-to-digital convertors that transform a first signal of an analog signal to a second signal of a digital signal. For example, and without limitation, an analog-to-digital converter may convert an analog input signal to a 10-bit binary digital representation of that signal. In another embodiment, signal transformation component 608 may include transforming one or more low-level languages such as, but not limited to, machine languages and/or assembly languages. For example, and without limitation, signal transformation component 608 may include transforming a binary language signal to an assembly language signal. In an embodiment, and without limitation, signal transformation component 608 may include transforming one or more high-level languages and/or formal languages such as but not limited to alphabets, strings, and/or languages. For example, and without limitation, high-level languages may include one or more system languages, scripting languages, domain-specific languages, visual languages, esoteric languages, and the like thereof. As a further non-limiting example, high-level languages may include one or more algebraic formula languages, business data languages, string and list languages, object-oriented languages, and the like thereof.

Still referring to FIG. 6, signal transformation component 608 may be configured to optimize an intermediate representation 612. As used in this disclosure an "intermediate representation" is a data structure and/or code that represents the input signal. Signal transformation component 608 may optimize intermediate representation as a function of a data-flow analysis, dependence analysis, alias analysis, pointer analysis, escape analysis, and the like thereof. In an embodiment, and without limitation, signal transformation component 608 may optimize intermediate representation 612 as a function of one or more inline expansions, dead code eliminations, constant propagation, loop transformations, and/or automatic parallelization functions. In another embodiment, signal transformation component 608 may optimize intermediate representation as a function of a machine dependent optimization such as a peephole optimization, wherein a peephole optimization may rewrite short sequences of code into more efficient sequences of code. Signal transformation component 608 may optimize intermediate representation to generate an output language, wherein an "output language," as used herein, is the native machine language of flight controller 604. For example, and without limitation, native machine language may include one or more binary and/or numerical languages.

In an embodiment, and without limitation, signal transformation component 608 may include transform one or more inputs and outputs as a function of an error correction code. An error correction code, also known as error correcting code (ECC), is an encoding of a message or lot of data using redundant information, permitting recovery of corrupted data. An ECC may include a block code, in which information is encoded on fixed-size packets and/or blocks of data elements such as symbols of predetermined size, bits, or the like. Reed-Solomon coding, in which message symbols within a symbol set having q symbols are encoded as coefficients of a polynomial of degree less than or equal to a natural number k, over a finite field/with q elements; strings so encoded have a minimum hamming distance of k+1, and permit correction of (q−k−1)/2 erroneous symbols. Block code may alternatively or additionally be implemented using Golay coding, also known as binary Golay coding, Bose-Chaudhuri, Hocquenghuem (BCH) coding, multidimensional parity-check coding, and/or Hamming codes. An ECC may alternatively or additionally be based on a convolutional code.

In an embodiment, and still referring to FIG. 6, flight controller 604 may include a reconfigurable hardware platform 616. A "reconfigurable hardware platform," as used herein, is a component and/or unit of hardware that may be reprogrammed, such that, for instance, a data path between elements such as logic gates or other digital circuit elements may be modified to change an algorithm, state, logical sequence, or the like of the component and/or unit. This may be accomplished with such flexible high-speed computing fabrics as field-programmable gate arrays (FPGAs), which may include a grid of interconnected logic gates, connections between which may be severed and/or restored to program in modified logic. Reconfigurable hardware platform 616 may be reconfigured to enact any algorithm and/or algorithm selection process received from another computing device and/or created using machine-learning processes.

Still referring to FIG. 6, reconfigurable hardware platform 616 may include a logic component 620. As used in this disclosure a "logic component" is a component that executes instructions on output language. For example, and without limitation, logic component may perform basic arithmetic, logic, controlling, input/output operations, and the like thereof. Logic component 620 may include any suitable processor, such as without limitation a component incorporating logical circuitry for performing arithmetic and logical operations, such as an arithmetic and logic unit (ALU), which may be regulated with a state machine and directed by operational inputs from memory and/or sensors; logic component 620 may be organized according to Von Neumann and/or Harvard architecture as a non-limiting example. Logic component 620 may include, incorporate, and/or be incorporated in, without limitation, a microcontroller, microprocessor, digital signal processor (DSP), Field Programmable Gate Array (FPGA), Complex Programmable Logic Device (CPLD), Graphical Processing Unit (GPU), general purpose GPU, Tensor Processing Unit (TPU), analog or mixed signal processor, Trusted Platform Module (TPM), a floating point unit (FPU), and/or system on a chip (SoC). In an embodiment, logic component 620 may include one or more integrated circuit microprocessors, which may contain one or more central processing units, central processors, and/or main processors, on a single metal-oxide-semiconductor chip. Logic component 620 may be configured to execute a sequence of stored instructions to be performed on the output language and/or intermediate representation 612. Logic component 620 may be configured to fetch and/or retrieve the instruction from a memory cache, wherein a "memory cache," as used in this disclosure, is a stored instruction set on flight controller 604. Logic component 620 may be configured to decode the instruction retrieved from the memory cache to opcodes and/or operands. Logic component 620 may be configured to execute the instruction on intermediate representation 612 and/or output language. For example, and without limitation, logic component 620 may be configured to execute an addition operation on intermediate representation 612 and/or output language.

In an embodiment, and without limitation, logic component 620 may be configured to calculate a flight element 624. As used in this disclosure a "flight element" is an element of datum denoting a relative status of aircraft. For example, and without limitation, flight element 624 may denote one or more torques, thrusts, airspeed velocities, forces, altitudes, groundspeed velocities, directions during flight, directions facing, forces, orientations, and the like thereof. For example, and without limitation, flight element 624 may denote that aircraft is cruising at an altitude and/or with a sufficient magnitude of forward thrust. As a further non-limiting example, flight status may denote that is building thrust and/or groundspeed velocity in preparation for a takeoff. As a further non-limiting example, flight element 624 may denote that aircraft is following a flight path accurately and/or sufficiently.

Still referring to FIG. 6, flight controller 604 may include a chipset component 628. As used in this disclosure a "chipset component" is a component that manages data flow. In an embodiment, and without limitation, chipset component 628 may include a northbridge data flow path, wherein the northbridge dataflow path may manage data flow from logic component 620 to a high-speed device and/or component, such as a RAM, graphics controller, and the like thereof. In another embodiment, and without limitation, chipset component 628 may include a southbridge data flow path, wherein the southbridge dataflow path may manage data flow from logic component 620 to lower-speed peripheral buses, such as a peripheral component interconnect (PCI), industry standard architecture (ICA), and the like thereof. In an embodiment, and without limitation, southbridge data flow path may include managing data flow between peripheral connections such as ethernet, USB, audio devices, and the like thereof. Additionally or alternatively, chipset component 628 may manage data flow between logic component 620, memory cache, and a flight component 632. As used in this disclosure a "flight component" is a portion of an aircraft that can be moved or adjusted to affect one or more flight elements. For example, flight component 632 may include a component used to affect the aircrafts' roll and pitch which may comprise one or more ailerons. As a further example, flight component 632 may include a rudder to control yaw of an aircraft. In an embodiment, chipset component 628 may be configured to communicate with a plurality of flight components as a function of flight element 624. For example, and without limitation, chipset component 628 may transmit to an aircraft rotor to reduce torque of a first lift propulsor and increase the forward thrust produced by a pusher component to perform a flight maneuver.

In an embodiment, and still referring to FIG. 6, flight controller 604 may be configured generate an autonomous function. As used in this disclosure an "autonomous function" is a mode and/or function of flight controller 604 that controls aircraft automatically. For example, and without limitation, autonomous function may perform one or more aircraft maneuvers, take offs, landings, altitude adjustments, flight leveling adjustments, turns, climbs, and/or descents. As a further non-limiting example, autonomous function may adjust one or more airspeed velocities, thrusts, torques, and/or groundspeed velocities. As a further non-limiting example, autonomous function may perform one or more flight path corrections and/or flight path modifications as a function of flight element 624. In an embodiment, autonomous function may include one or more modes of autonomy such as, but not limited to, autonomous mode, semi-autonomous mode, and/or non-autonomous mode. As used in this disclosure "autonomous mode" is a mode that automatically adjusts and/or controls aircraft and/or the maneuvers of aircraft in its entirety. For example, autonomous mode may denote that flight controller 604 will adjust the aircraft. As used in this disclosure a "semi-autonomous mode" is a mode that automatically adjusts and/or controls a portion and/or section of aircraft. For example, and without limitation, semi-autonomous mode may denote that a pilot will control the propulsors, wherein flight controller 604 will control the ailerons and/or rudders. As used in this disclosure "non-autonomous mode" is a mode that denotes a pilot will control aircraft and/or maneuvers of aircraft in its entirety.

In an embodiment, and still referring to FIG. 6, flight controller 604 may generate autonomous function as a function of an autonomous machine-learning model. As used in this disclosure an "autonomous machine-learning model" is a machine-learning model to produce an autonomous function output given flight element 624 and a pilot signal 636 as inputs; this is in contrast to a non-machine learning software program where the commands to be executed are determined in advance by a user and written in a programming language. As used in this disclosure a "pilot signal" is an element of datum representing one or more functions a pilot is controlling and/or adjusting. For example, pilot signal 636 may denote that a pilot is controlling and/or maneuvering ailerons, wherein the pilot is not in control of the rudders and/or propulsors. In an embodiment, pilot signal 636 may include an implicit signal and/or an explicit signal. For example, and without limitation, pilot signal 636 may include an explicit signal, wherein the pilot explicitly states there is a lack of control and/or desire for autonomous function. As a further non-limiting example, pilot signal 636 may include an explicit signal directing flight controller 604 to control and/or maintain a portion of aircraft, a portion of the flight plan, the entire aircraft, and/or the entire flight plan. As a further non-limiting example, pilot signal 636 may include an implicit signal, wherein flight controller 604 detects a lack of control such as by a malfunction, torque alteration, flight path deviation, and the like thereof. In an embodiment, and without limitation, pilot signal 636 may include one or more explicit signals to reduce torque, and/or one or more implicit signals that torque may be reduced due to reduction of airspeed velocity. In an embodiment, and without limitation, pilot signal 636 may include one or more local and/or global signals. For example, and without limitation, pilot signal 636 may include a local signal that is transmitted by a pilot and/or crew member. As a further non-limiting example, pilot signal 636 may include a global signal that is transmitted by air traffic control and/or one or more remote users that are in communication with the pilot of aircraft. In an embodiment, pilot signal 636 may be received as a function of a tri-state bus and/or multiplexor that denotes an explicit pilot signal should be transmitted prior to any implicit or global pilot signal.

Still referring to FIG. 6, autonomous machine-learning model may include one or more autonomous machine-learning processes such as supervised, unsupervised, or reinforcement machine-learning processes that flight controller 604 and/or a remote device may or may not use in the generation of autonomous function. As used in this disclosure "remote device" is an external device to flight controller 604. Additionally or alternatively, autonomous machine-learning model may include one or more autonomous machine-learning processes that a field-programmable gate array (FPGA) may or may not use in the generation of autonomous function. Autonomous machine-learning process may include, without limitation machine learning processes such as simple linear regression, multiple linear regression, polynomial regression, support vector regression, ridge regression, lasso regression, elasticnet regression, decision tree regression, random forest regression, logistic regression, logistic classification, K-nearest neighbors, support vector machines, kernel support vector machines, naïve bayes, decision tree classification, random forest classification, K-means clustering, hierarchical clustering, dimensionality reduction, principal component analysis, linear discriminant analysis, kernel principal component analysis, Q-learning, State Action Reward State Action (SARSA), Deep-Q network, Markov decision processes, Deep Deterministic Policy Gradient (DDPG), or the like thereof.

In an embodiment, and still referring to FIG. 6, autonomous machine learning model may be trained as a function of autonomous training data, wherein autonomous training data May correlate a flight element, pilot signal, and/or simulation data to an autonomous function. For example, and without limitation, a flight element of an airspeed velocity, a pilot signal of limited and/or no control of propulsors, and a simulation data of required airspeed velocity to reach the destination may result in an autonomous function that includes a semi-autonomous mode to increase thrust of the propulsors. Autonomous training data may be received as a function of user-entered valuations of flight elements, pilot signals, simulation data, and/or autonomous functions. Flight controller 604 may receive autonomous training data by receiving correlations of flight element, pilot signal, and/or simulation data to an autonomous function that were previously received and/or determined during a previous iteration of generation of autonomous function. Autonomous training data may be received by one or more remote devices and/or FPGAs that at least correlate a flight element, pilot signal, and/or simulation data to an autonomous function. Autonomous training data may be received in the form of one or more user-entered correlations of a flight element, pilot signal, and/or simulation data to an autonomous function.

Still referring to FIG. 6, flight controller 604 may receive autonomous machine-learning model from a remote device and/or FPGA that utilizes one or more autonomous machine learning processes, wherein a remote device and an FPGA is described above in detail. For example, and without limitation, a remote device may include a computing device, external device, processor, FPGA, microprocessor and the like thereof. Remote device and/or FPGA may perform the autonomous machine-learning process using autonomous training data to generate autonomous function and transmit the output to flight controller 604. Remote device and/or FPGA may transmit a signal, bit, datum, or parameter to flight controller 604 that at least relates to autonomous function. Additionally or alternatively, the remote device and/or FPGA may provide an updated machine-learning model. For example, and without limitation, an updated machine-learning model may be comprised of a firmware update, a software update, a autonomous machine-learning process correction, and the like thereof. As a non-limiting example a software update may incorporate a new simulation data that relates to a modified flight element. Additionally or alternatively, the updated machine learning model may be transmitted to the remote device and/or FPGA, wherein the remote device and/or FPGA may replace the autonomous machine-learning model with the updated machine-learning model and generate the autonomous function as a function of the flight element, pilot signal, and/or simulation data using the updated machine-learning model. The updated machine-learning model may be transmitted by the remote device and/or FPGA and received by flight controller 604 as a software update, firmware update, or corrected autonomous machine-learning model. For example, and without limitation autonomous machine learning model May utilize a neural net machine-learning process, wherein the updated machine-learning model may incorporate a gradient boosting machine-learning process.

Still referring to FIG. 6, flight controller 604 may include, be included in, and/or communicate with a mobile device such as a mobile telephone or smartphone. Further, flight controller may communicate with one or more additional devices as described below in further detail via a network interface device. The network interface device may be utilized for commutatively connecting a flight controller to one or more of a variety of networks, and one or more devices. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. The network may include any network topology and can may employ a wired and/or a wireless mode of communication.

In an embodiment, and still referring to FIG. 6, flight controller 604 may include, but is not limited to, for example, a cluster of flight controllers in a first location and a second flight controller or cluster of flight controllers in a second location. Flight controller 604 may include one or more flight controllers dedicated to data storage, security, distribution of traffic for load balancing, and the like. Flight controller 604 may be configured to distribute one or more computing tasks as described below across a plurality of flight controllers, which may operate in parallel, in series, redundantly, or in any other manner used for distribution of tasks or memory between computing devices. For example, and without limitation, flight controller 604 may implement a control algorithm to distribute and/or command the plurality of flight controllers. As used in this disclosure a "control algorithm" is a finite sequence of well-defined computer implementable instructions that may determine the flight component of the plurality of flight components to be adjusted. For example, and without limitation, control algorithm may include one or more algorithms that reduce and/or prevent aviation asymmetry. As a further non-limiting example, control algorithms may include one or more models generated as a function of a software including, but not limited to Simulink by MathWorks, Natick, Massachusetts, USA. In an embodiment, and without limitation, control algorithm may be configured to generate an auto-code, wherein an "auto-code," is used herein, is a code and/or algorithm that is generated as a function of the one or more models and/or software's. In another embodiment, control algorithm may be configured to produce a segmented control algorithm. As used in this disclosure a "segmented control algorithm" is control algorithm that has been separated and/or parsed into discrete sections. For example, and without limitation, segmented control algorithm may parse control algorithm into two or more segments, wherein each segment of control algorithm may be performed by one or more flight controllers operating on distinct flight components.

In an embodiment, and still referring to FIG. 6, control algorithm may be configured to determine a segmentation boundary as a function of segmented control algorithm. As used in this disclosure a "segmentation boundary" is a limit and/or delineation associated with the segments of the segmented control algorithm. For example, and without limitation, segmentation boundary may denote that a segment in the control algorithm has a first starting section and/or a first ending section. As a further non-limiting example, segmentation boundary may include one or more boundaries associated with an ability of flight component 632. In an embodiment, control algorithm may be configured to create an optimized signal communication as a function of segmentation boundary. For example, and without limitation, optimized signal communication may include identifying the discrete timing required to transmit and/or receive the one or more segmentation boundaries. In an embodiment, and without limitation, creating optimized signal communication further comprises separating a plurality of signal codes across the plurality of flight controllers. For example, and without limitation the plurality of flight controllers may include one or more formal networks, wherein formal networks transmit data along an authority chain and/or are limited to task-related communications. As a further non-limiting example, communication network may include informal networks, wherein informal networks transmit data in any direction. In an embodiment, and without limitation, the plurality of flight controllers may include a chain path, wherein a "chain path," as used herein, is a linear communication path comprising a hierarchy that data may flow through. In an embodiment, and without limitation, the plurality of flight controllers may include an all-channel path, wherein an "all-channel path," as used herein, is a communication path that is not restricted to a particular direction. For example, and without limitation, data may be transmitted upward, downward, laterally, and the like thereof. In an embodiment, and without limitation, the plurality of flight controllers may include one or more neural networks that assign a weighted value to a transmitted datum. For example, and without limitation, a weighted value may be assigned as a function of one or more signals denoting that a flight component is malfunctioning and/or in a failure state.

Still referring to FIG. 6, the plurality of flight controllers may include a master bus controller. As used in this disclosure a "master bus controller" is one or more devices and/or components that are connected to a bus to initiate a direct memory access transaction, wherein a bus is one or more terminals in a bus architecture. Master bus controller may communicate using synchronous and/or asynchronous bus control protocols. In an embodiment, master bus controller may include flight controller 604. In another embodiment, master bus controller may include one or more universal asynchronous receiver-transmitters (UART). For example, and without limitation, master bus controller may include one or more bus architectures that allow a bus to initiate a direct memory access transaction from one or more buses in the bus architectures. As a further non-limiting example, master bus controller may include one or more peripheral devices and/or components to communicate with another peripheral device and/or component and/or the master bus controller. In an embodiment, master bus controller may be configured to perform bus arbitration. As used in this disclosure "bus arbitration" is method and/or scheme to prevent multiple buses from attempting to communicate with and/or connect to master bus controller. For example and without limitation, bus arbitration may include one or more schemes such as a small computer interface system, wherein a small computer interface system is a set of standards for physical connecting and transferring data between peripheral devices and master bus controller by defining commands, protocols, electrical, optical, and/or logical interfaces. In an embodiment, master bus controller may receive intermediate representation 612 and/or output language from logic component 620, wherein output language may include one or more analog-to-digital conversions, low bit rate transmissions, message encryptions, digital signals, binary signals, logic signals, analog signals, and the like thereof described above in detail.

Still referring to FIG. 6, master bus controller may communicate with a slave bus. As used in this disclosure a "slave bus" is one or more peripheral devices and/or components that initiate a bus transfer. For example, and without limitation, slave bus may receive one or more controls and/or asymmetric communications from master bus controller, wherein slave bus transfers data stored to master bus controller. In an embodiment, and without limitation, slave bus may include one or more internal buses, such as but not limited to a/an internal data bus, memory bus, system bus, front-side bus, and the like thereof. In another embodiment, and without limitation, slave bus may include one or more external buses such as external flight controllers, external computers, remote devices, printers, aircraft computer systems, flight control systems, and the like thereof.

In an embodiment, and still referring to FIG. 6, control algorithm may optimize signal communication as a function of determining one or more discrete timings. For example, and without limitation master bus controller may synchronize timing of the segmented control algorithm by injecting high priority timing signals on a bus of the master bus control. As used in this disclosure a "high priority timing signal" is information denoting that the information is important. For example, and without limitation, high priority timing signal may denote that a section of control algorithm is of high priority and should be analyzed and/or transmitted prior to any other sections being analyzed and/or transmitted. In an embodiment, high priority timing signal may include one or more priority packets. As used in this disclosure a "priority packet" is a formatted unit of data that is communicated between the plurality of flight controllers. For example, and without limitation, priority packet may denote that a section of control algorithm should be used and/or is of greater priority than other sections.

Still referring to FIG. 6, flight controller 604 may also be implemented using a "shared nothing" architecture in which data is cached at the worker, in an embodiment, this may enable scalability of aircraft and/or computing device. Flight controller 604 may include a distributer flight controller. As used in this disclosure a "distributer flight controller" is a component that adjusts and/or controls a plurality of flight components as a function of a plurality of flight controllers. For example, distributer flight controller may include a flight controller that communicates with a plurality of additional flight controllers and/or clusters of flight controllers. In an embodiment, distributed flight control may include one or more neural networks. For example, neural network also known as an artificial neural network, is a network of "nodes," or data structures having one or more inputs, one or more outputs, and a function determining outputs based on inputs. Such nodes may be organized in a network, such as without limitation a convolutional neural network, including an input layer of nodes, one or more intermediate layers, and an output layer of nodes. Connections between nodes may be created via the process of "training" the network, in which elements from a training dataset are applied to the input nodes, a suitable training algorithm (such as Levenberg-Marquardt, conjugate gradient, simulated annealing, or other algorithms) is then used to adjust the connections and weights between nodes in adjacent layers of the neural network to produce the desired values at the output nodes. This process is sometimes referred to as deep learning.

Still referring to FIG. 6, a node may include, without limitation a plurality of inputs $x_i$ that may receive numerical values from inputs to a neural network containing the node and/or from other nodes. Node may perform a weighted sum of inputs using weights $w_i$ that are multiplied by respective inputs $x_i$. Additionally or alternatively, a bias b may be added to the weighted sum of the inputs such that an offset is added to each unit in the neural network layer that is independent of the input to the layer. The weighted sum may then be input into a function φ, which may generate one or more outputs y. Weight $w_i$ applied to an input $x_i$ may indicate whether the input is "excitatory," indicating that it has strong influence on the one or more outputs y, for instance by the corresponding weight having a large numerical value, and/or a "inhibitory," indicating it has a weak effect influence on the one more inputs y, for instance by the corresponding weight having a small numerical value. The values of weights $w_i$ may be determined by training a neural network using training data, which may be performed using any suitable process as described above. In an embodiment, and without limitation, a neural network may receive semantic units as inputs and output vectors representing such semantic units according to weights $w_i$ that are derived using machine-learning processes as described in this disclosure.

Still referring to FIG. 6, flight controller may include a sub-controller 640. As used in this disclosure a "sub-controller" is a controller and/or component that is part of a distributed controller as described above; for instance, flight controller 604 may be and/or include a distributed flight controller made up of one or more sub-controllers. For example, and without limitation, sub-controller 640 may include any controllers and/or components thereof that are similar to distributed flight controller and/or flight controller as described above. Sub-controller 640 may include any component of any flight controller as described above. Sub-controller 640 may be implemented in any manner suitable for implementation of a flight controller as described above. As a further non-limiting example, sub-controller 640 may include one or more processors, logic components and/or computing devices capable of receiving, processing, and/or transmitting data across the distributed flight controller as described above. As a further non-limiting example, sub-controller 640 may include a controller that receives a signal from a first flight controller and/or first distributed flight controller component and transmits the signal to a plurality of additional sub-controllers and/or flight components.

Still referring to FIG. 6, flight controller may include a co-controller 644. As used in this disclosure a "co-controller" is a controller and/or component that joins flight controller 604 as components and/or nodes of a distributer flight controller as described above. For example, and without limitation, co-controller 644 may include one or more controllers and/or components that are similar to flight controller 604. As a further non-limiting example, co-controller 644 may include any controller and/or component that joins flight controller 604 to distributer flight controller. As a further non-limiting example, co-controller 644 may include one or more processors, logic components and/or computing devices capable of receiving, processing, and/or transmitting data to and/or from flight controller 604 to distributed flight control system. Co-controller 644 may include any component of any flight controller as described above. Co-controller 644 may be implemented in any manner suitable for implementation of a flight controller as described above.

In an embodiment, and with continued reference to FIG. 6, flight controller 604 may be designed and/or configured to perform any method, method step, or sequence of method steps in any embodiment described in this disclosure, in any order and with any degree of repetition. For instance, flight controller 604 may be configured to perform a single step or sequence repeatedly until a desired or commanded outcome is achieved; repetition of a step or a sequence of steps may be performed iteratively and/or recursively using outputs of previous repetitions as inputs to subsequent repetitions, aggregating inputs and/or outputs of repetitions to produce an aggregate result, reduction or decrement of one or more variables such as global variables, and/or division of a larger processing task into a set of iteratively addressed smaller processing tasks. Flight controller may perform any step or sequence of steps as described in this disclosure in parallel, such as simultaneously and/or substantially simultaneously performing a step two or more times using two or more parallel threads, processor cores, or the like; division of tasks between parallel threads and/or processes may be performed according to any protocol suitable for division of tasks between iterations. Persons skilled in the art, upon reviewing the entirety of this disclosure, will be aware of various ways in which steps, sequences of steps, processing tasks, and/or data may be subdivided, shared, or otherwise dealt with using iteration, recursion, and/or parallel processing.

Figure 7:
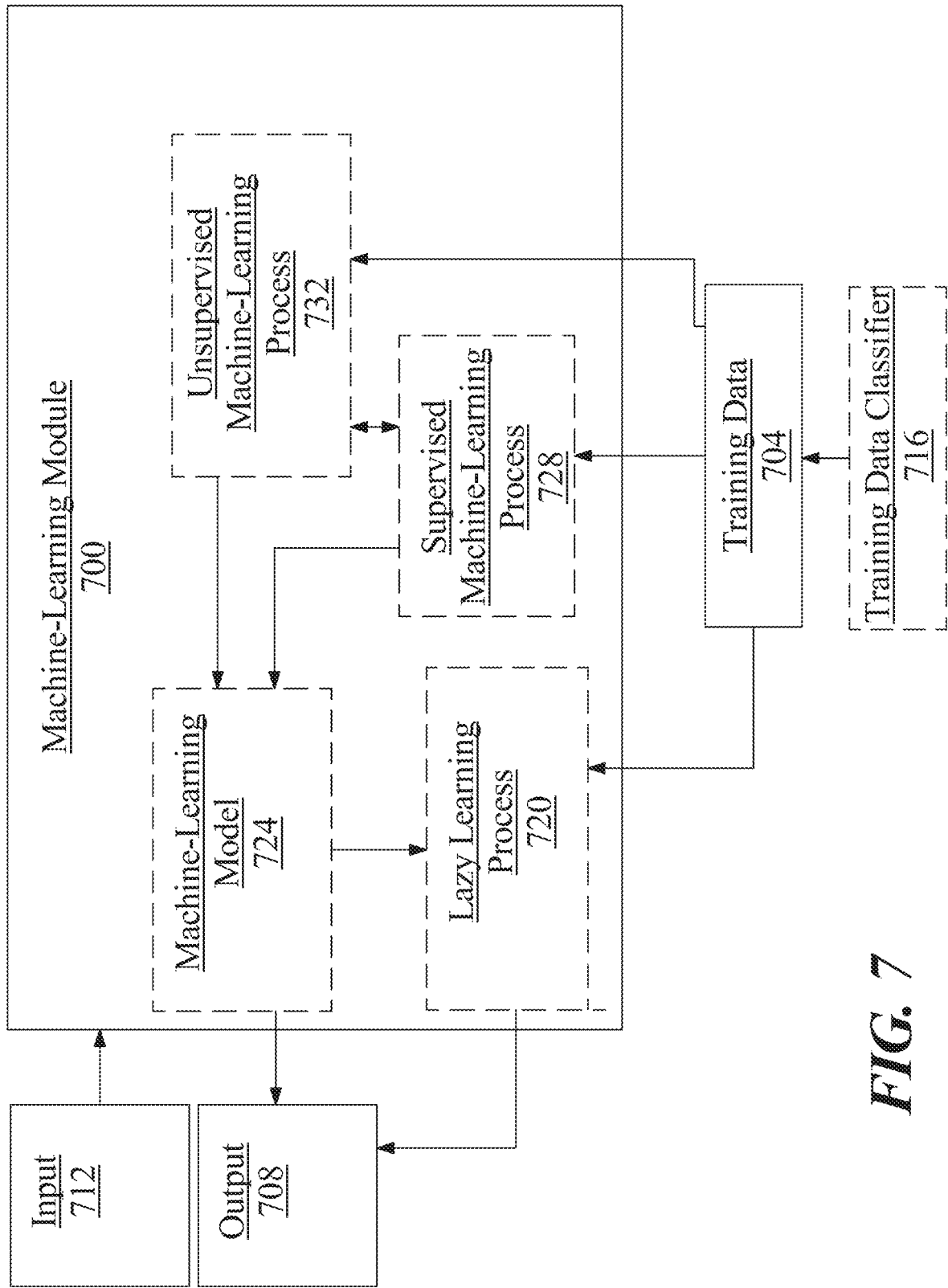
FIG. 7 is a block diagram illustrating exemplary machine-learning processes.

Referring now to FIG. 7, an exemplary embodiment of a machine-learning module 700 that may perform one or more machine-learning processes as described in this disclosure is illustrated. Machine-learning module may perform determinations, classification, and/or analysis steps, methods, processes, or the like as described in this disclosure using machine learning processes. A "machine learning process," as used in this disclosure, is a process that automatedly uses training data 704 to generate an algorithm that will be performed by a computing device/module to produce outputs 708 given data provided as inputs 712; this is in contrast to a non-machine learning software program where the commands to be executed are determined in advance by a user and written in a programming language.

Still referring to FIG. 7, "training data," as used herein, is data containing correlations that a machine-learning process may use to model relationships between two or more categories of data elements. For instance, and without limitation, training data 704 may include a plurality of data entries, each entry representing a set of data elements that were recorded, received, and/or generated together; data elements may be correlated by shared existence in a given data entry, by proximity in a given data entry, or the like. Multiple data entries in training data 704 may evince one or more trends in correlations between categories of data elements; for instance, and without limitation, a higher value of a first data element belonging to a first category of data element may tend to correlate to a higher value of a second data element belonging to a second category of data element, indicating a possible proportional or other mathematical relationship linking values belonging to the two categories. Multiple categories of data elements may be related in training data 704 according to various correlations; correlations may indicate causative and/or predictive links between categories of data elements, which may be modeled as relationships such as mathematical relationships by machine-learning processes as described in further detail below. Training data 704 may be formatted and/or organized by categories of data elements, for instance by associating data elements with one or more descriptors corresponding to categories of data elements. As a non-limiting example, training data 704 may include data entered in standardized forms by persons or processes, such that entry of a given data element in a given field in a form may be mapped to one or more descriptors of categories. Elements in training data 704 may be linked to descriptors of categories by tags, tokens, or other data elements; for instance, and without limitation, training data 704 may be provided in fixed-length formats, formats linking positions of data to categories such as comma-separated value (CSV) formats and/or self-describing formats such as extensible markup language (XML), JavaScript Object Notation (JSON), or the like, enabling processes or devices to detect categories of data.

Alternatively or additionally, and continuing to refer to FIG. 7, training data 704 may include one or more elements that are not categorized; that is, training data 704 may not be formatted or contain descriptors for some elements of data. Machine-learning algorithms and/or other processes may sort training data 704 according to one or more categorizations using, for instance, natural language processing algorithms, tokenization, detection of correlated values in raw data and the like; categories may be generated using correlation and/or other processing algorithms. As a non-limiting example, in a corpus of text, phrases making up a number "n" of compound words, such as nouns modified by other nouns, may be identified according to a statistically significant prevalence of n-grams containing such words in a particular order; such an n-gram may be categorized as an element of language such as a "word" to be tracked similarly to single words, generating a new category as a result of statistical analysis. Similarly, in a data entry including some textual data, a person's name may be identified by reference to a list, dictionary, or other compendium of terms, permitting ad-hoc categorization by machine-learning algorithms, and/or automated association of data in the data entry with descriptors or into a given format. The ability to categorize data entries automatedly may enable the same training data 704 to be made applicable for two or more distinct machine-learning algorithms as described in further detail below. Training data 704 used by machine-learning module 700 may correlate any input data as described in this disclosure to any output data as described in this disclosure. As a non-limiting illustrative example flight elements and/or pilot signals may be inputs, wherein an output may be an autonomous function.

Further referring to FIG. 7, training data may be filtered, sorted, and/or selected using one or more supervised and/or unsupervised machine-learning processes and/or models as described in further detail below; such models may include without limitation a training data classifier 716. Training data classifier 716 may include a "classifier," which as used in this disclosure is a machine-learning model as defined below, such as a mathematical model, neural net, or program generated by a machine learning algorithm known as a "classification algorithm," as described in further detail below, that sorts inputs into categories or bins of data, outputting the categories or bins of data and/or labels associated therewith. A classifier may be configured to output at least a datum that labels or otherwise identifies a set of data that are clustered together, found to be close under a distance metric as described below, or the like. Machine-learning module 700 may generate a classifier using a classification algorithm, defined as a processes whereby a computing device and/or any module and/or component operating thereon derives a classifier from training data 704. Classification may be performed using, without limitation, linear classifiers such as without limitation logistic regression and/or naive Bayes classifiers, nearest neighbor classifiers such as k-nearest neighbors classifiers, support vector machines, least squares support vector machines, fisher's linear discriminant, quadratic classifiers, decision trees, boosted trees, random forest classifiers, learning vector quantization, and/or neural network-based classifiers. As a non-limiting example, training data classifier 416 may classify elements of training data to sub-categories of flight elements such as torques, forces, thrusts, directions, and the like thereof.

Still referring to FIG. 7, machine-learning module 700 may be configured to perform a lazy-learning process 720 and/or protocol, which may alternatively be referred to as a "lazy loading" or "call-when-needed" process and/or protocol, may be a process whereby machine learning is conducted upon receipt of an input to be converted to an output, by combining the input and training set to derive the algorithm to be used to produce the output on demand. For instance, an initial set of simulations may be performed to cover an initial heuristic and/or "first guess" at an output and/or relationship. As a non-limiting example, an initial heuristic may include a ranking of associations between inputs and elements of training data 704. Heuristic may include selecting some number of highest-ranking associations and/or training data 704 elements. Lazy learning may implement any suitable lazy learning algorithm, including without limitation a K-nearest neighbors algorithm, a lazy naïve Bayes algorithm, or the like; persons skilled in the art, upon reviewing the entirety of this disclosure, will be aware of various lazy-learning algorithms that may be applied to generate outputs as described in this disclosure, including without limitation lazy learning applications of machine-learning algorithms as described in further detail below.

Alternatively or additionally, and with continued reference to FIG. 7, machine-learning processes as described in this disclosure may be used to generate machine-learning models 724. A "machine-learning model," as used in this disclosure, is a mathematical and/or algorithmic representation of a relationship between inputs and outputs, as generated using any machine-learning process including without limitation any process as described above, and stored in memory; an input is submitted to a machine-learning model 724 once created, which generates an output based on the relationship that was derived. For instance, and without limitation, a linear regression model, generated using a linear regression algorithm, may compute a linear combination of input data using coefficients derived during machine-learning processes to calculate an output datum. As a further non-limiting example, a machine-learning model 724 may be generated by creating an artificial neural network, such as a convolutional neural network comprising an input layer of nodes, one or more intermediate layers, and an output layer of nodes. Connections between nodes may be created via the process of "training" the network, in which elements from a training data 704 set are applied to the input nodes, a suitable training algorithm (such as Levenberg-Marquardt, conjugate gradient, simulated annealing, or other algorithms) is then used to adjust the connections and weights between nodes in adjacent layers of the neural network to produce the desired values at the output nodes. This process is sometimes referred to as deep learning.

Still referring to FIG. 7, machine-learning algorithms may include at least a supervised machine-learning process 728. At least a supervised machine-learning process 728, as defined herein, include algorithms that receive a training set relating a number of inputs to a number of outputs, and seek to find one or more mathematical relations relating inputs to outputs, where each of the one or more mathematical relations is optimal according to some criterion specified to the algorithm using some scoring function. For instance, a supervised learning algorithm may include flight elements and/or pilot signals as described above as inputs, autonomous functions as outputs, and a scoring function representing a desired form of relationship to be detected between inputs and outputs; scoring function may, for instance, seek to maximize the probability that a given input and/or combination of elements inputs is associated with a given output to minimize the probability that a given input is not associated with a given output. Scoring function may be expressed as a risk function representing an "expected loss" of an algorithm relating inputs to outputs, where loss is computed as an error function representing a degree to which a prediction generated by the relation is incorrect when compared to a given input-output pair provided in training data 704. Persons skilled in the art, upon reviewing the entirety of this disclosure, will be aware of various possible variations of at least a supervised machine-learning process 728 that may be used to determine relation between inputs and outputs. Supervised machine-learning processes may include classification algorithms as defined above.

Further referring to FIG. 7, machine learning processes may include at least an unsupervised machine-learning processes 732. An unsupervised machine-learning process, as used herein, is a process that derives inferences in datasets without regard to labels; as a result, an unsupervised machine-learning process may be free to discover any structure, relationship, and/or correlation provided in the data. Unsupervised processes may not require a response variable; unsupervised processes may be used to find interesting patterns and/or inferences between variables, to determine a degree of correlation between two or more variables, or the like.

Still referring to FIG. 7, machine-learning module 700 may be designed and configured to create a machine-learning model 724 using techniques for development of linear regression models. Linear regression models may include ordinary least squares regression, which aims to minimize the square of the difference between predicted outcomes and actual outcomes according to an appropriate norm for measuring such a difference (e.g. a vector-space distance norm); coefficients of the resulting linear equation may be modified to improve minimization. Linear regression models may include ridge regression methods, where the function to be minimized includes the least-squares function plus term multiplying the square of each coefficient by a scalar amount to penalize large coefficients. Linear regression models may include least absolute shrinkage and selection operator (LASSO) models, in which ridge regression is combined with multiplying the least-squares term by a factor of 1 divided by double the number of samples. Linear regression models may include a multi-task lasso model wherein the norm applied in the least-squares term of the lasso model is the Frobenius norm amounting to the square root of the sum of squares of all terms. Linear regression models may include the elastic net model, a multi-task elastic net model, a least angle regression model, a LARS lasso model, an orthogonal matching pursuit model, a Bayesian regression model, a logistic regression model, a stochastic gradient descent model, a perceptron model, a passive aggressive algorithm, a robustness regression model, a Huber regression model, or any other suitable model that may occur to persons skilled in the art upon reviewing the entirety of this disclosure. Linear regression models may be generalized in an embodiment to polynomial regression models, whereby a polynomial equation (e.g. a quadratic, cubic or higher-order equation) providing a best predicted output/actual output fit is sought; similar methods to those described above may be applied to minimize error functions, as will be apparent to persons skilled in the art upon reviewing the entirety of this disclosure.

Continuing to refer to FIG. 7, machine-learning algorithms may include, without limitation, linear discriminant analysis. Machine-learning algorithm may include quadratic discriminate analysis. Machine-learning algorithms may include kernel ridge regression. Machine-learning algorithms may include support vector machines, including without limitation support vector classification-based regression processes. Machine-learning algorithms may include stochastic gradient descent algorithms, including classification and regression algorithms based on stochastic gradient descent. Machine-learning algorithms may include nearest neighbors algorithms. Machine-learning algorithms may include Gaussian processes such as Gaussian Process Regression. Machine-learning algorithms may include cross-decomposition algorithms, including partial least squares and/or canonical correlation analysis. Machine-learning algorithms may include naïve Bayes methods. Machine-learning algorithms may include algorithms based on decision trees, such as decision tree classification or regression algorithms. Machine-learning algorithms may include ensemble methods such as bagging meta-estimator, forest of randomized tress, AdaBoost, gradient tree boosting, and/or voting classifier methods. Machine-learning algorithms may include neural net algorithms, including convolutional neural net processes.

Figure 8:
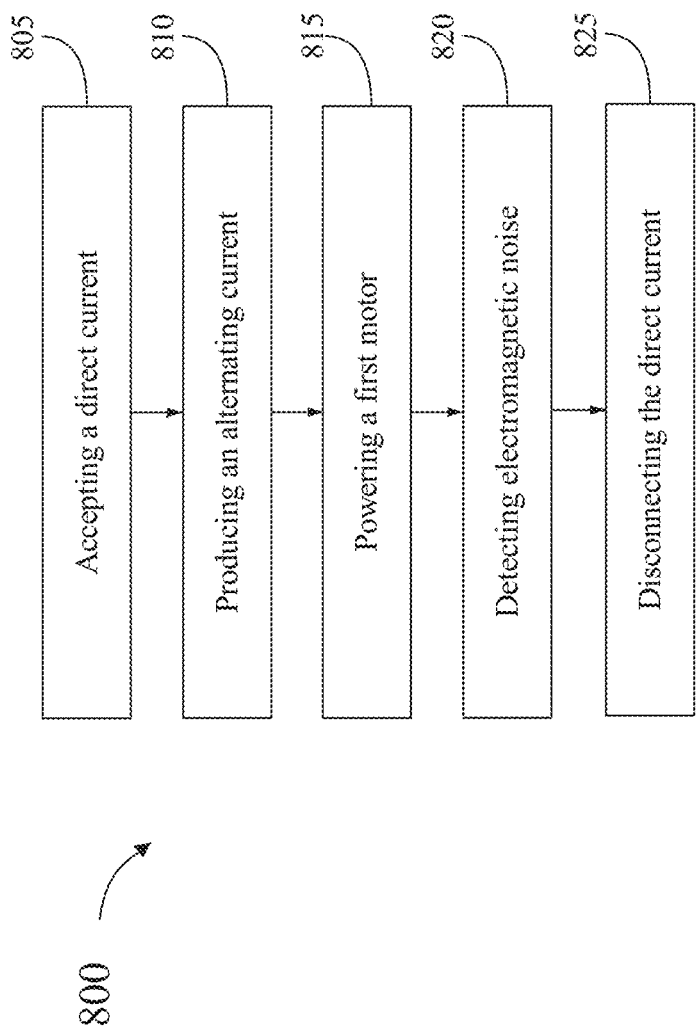
FIG. 8 is a flow diagram of an exemplary method of electric propulsor fault detection.

Referring now to FIG. 8, an exemplary method 800 of electric propulsor fault detection is illustrated by way of flow diagram. At step 805, method 800 may include accepting, using at least a first inverter, a direct current. First inverter may include any inverter described in this disclosure, for example with reference to FIGS. 1-7. Direct current may include any direct current described in this disclosure, for example with reference to FIGS. 1-7.

With continued reference to FIG. 8, at step 810, method 800 may include producing, using at least a first inverter, an alternating current. Alternating current may include any alternating current described in this disclosure, for example with reference to FIGS. 1-7.

With continued reference to FIG. 8, at step 815, method 800 may include powering, using alternating current, a first motor operatively connected with a first propulsor. First motor may include any motor described in this disclosure, for example with reference to FIGS. 1-7. First propulsor may include any propulsor described in this disclosure, for example with reference to FIGS. 1-7.

With continued reference to FIG. 8, at step 820, method 800 may include detecting, using at least a noise monitoring circuit electrically connected with direct current, electromagnetic noise. Noise monitoring circuit may include any noise monitoring circuit described in this disclosure, for example with reference to FIGS. 1-7. Electromagnetic noise may include any electromagnetic noise described in this disclosure, for example with reference to FIGS. 1-7. In some embodiments, at least a noise monitoring circuit may include an electromagnetic interference (EMI) filter. In some versions, noise monitoring circuit may include at least a noise detection signal inductively connected with EMI filter. In some versions, electromagnetic noise may include a common mode noise; and EMI filter may include a common mode filter. In some versions, electromagnetic noise may include a differential mode noise; and EMI filter may include a differential mode filter. In some embodiments, electromagnetic noise may be indicative of fault. In some cases, fault may include a motor fault. In some cases, fault may include an inverter fault.

With continued reference to FIG. 8, at step 825, method 800 may include disengaging, using at least a noise monitoring circuit, at least an inverter as a function of electromagnetic noise.

Still referring to FIG. 8, in some embodiments, first propulsor may be mounted to an electric aircraft; and method 800 may additionally include producing, using the first propulsor, lift. In some versions, method 800 may additionally include powering, using a second inverter, a second motor operatively connected with a second propulsor and producing, using the second propulsor mounted to the electric aircraft, lift. In some versions, electromagnetic noise disturbs at least one of second inverter, second motor, and second propulsor.

It is to be noted that any one or more of the aspects and embodiments described herein may be conveniently implemented using one or more machines (e.g., one or more computing devices that are utilized as a user computing device for an electronic document, one or more server devices, such as a document server, etc.) programmed according to the teachings of the present specification, as will be apparent to those of ordinary skill in the computer art. Appropriate software coding can readily be prepared by skilled programmers based on the teachings of the present disclosure, as will be apparent to those of ordinary skill in the software art. Aspects and implementations discussed above employing software and/or software modules may also include appropriate hardware for assisting in the implementation of the machine executable instructions of the software and/or software module.

Such software may be a computer program product that employs a machine-readable storage medium. A machine-readable storage medium may be any medium that is capable of storing and/or encoding a sequence of instructions for execution by a machine (e.g., a computing device) and that causes the machine to perform any one of the methodologies and/or embodiments described herein. Examples of a machine-readable storage medium include, but are not limited to, a magnetic disk, an optical disc (e.g., CD, CD-R, DVD, DVD-R, etc.), a magneto-optical disk, a read-only memory "ROM" device, a random-access memory "RAM" device, a magnetic card, an optical card, a solid-state memory device, an EPROM, an EEPROM, and any combinations thereof. A machine-readable medium, as used herein, is intended to include a single medium as well as a collection of physically separate media, such as, for example, a collection of compact discs or one or more hard disk drives in combination with a computer memory. As used herein, a machine-readable storage medium does not include transitory forms of signal transmission.

Such software may also include information (e.g., data) carried as a data signal on a data carrier, such as a carrier wave. For example, machine-executable information may be included as a data-carrying signal embodied in a data carrier in which the signal encodes a sequence of instruction, or portion thereof, for execution by a machine (e.g., a computing device) and any related information (e.g., data structures and data) that causes the machine to perform any one of the methodologies and/or embodiments described herein.

Examples of a computing device include, but are not limited to, an electronic book reading device, a computer workstation, a terminal computer, a server computer, a handheld device (e.g., a tablet computer, a smartphone, etc.), a web appliance, a network router, a network switch, a network bridge, any machine capable of executing a sequence of instructions that specify an action to be taken by that machine, and any combinations thereof. In one example, a computing device may include and/or be included in a kiosk.

Figure 9:
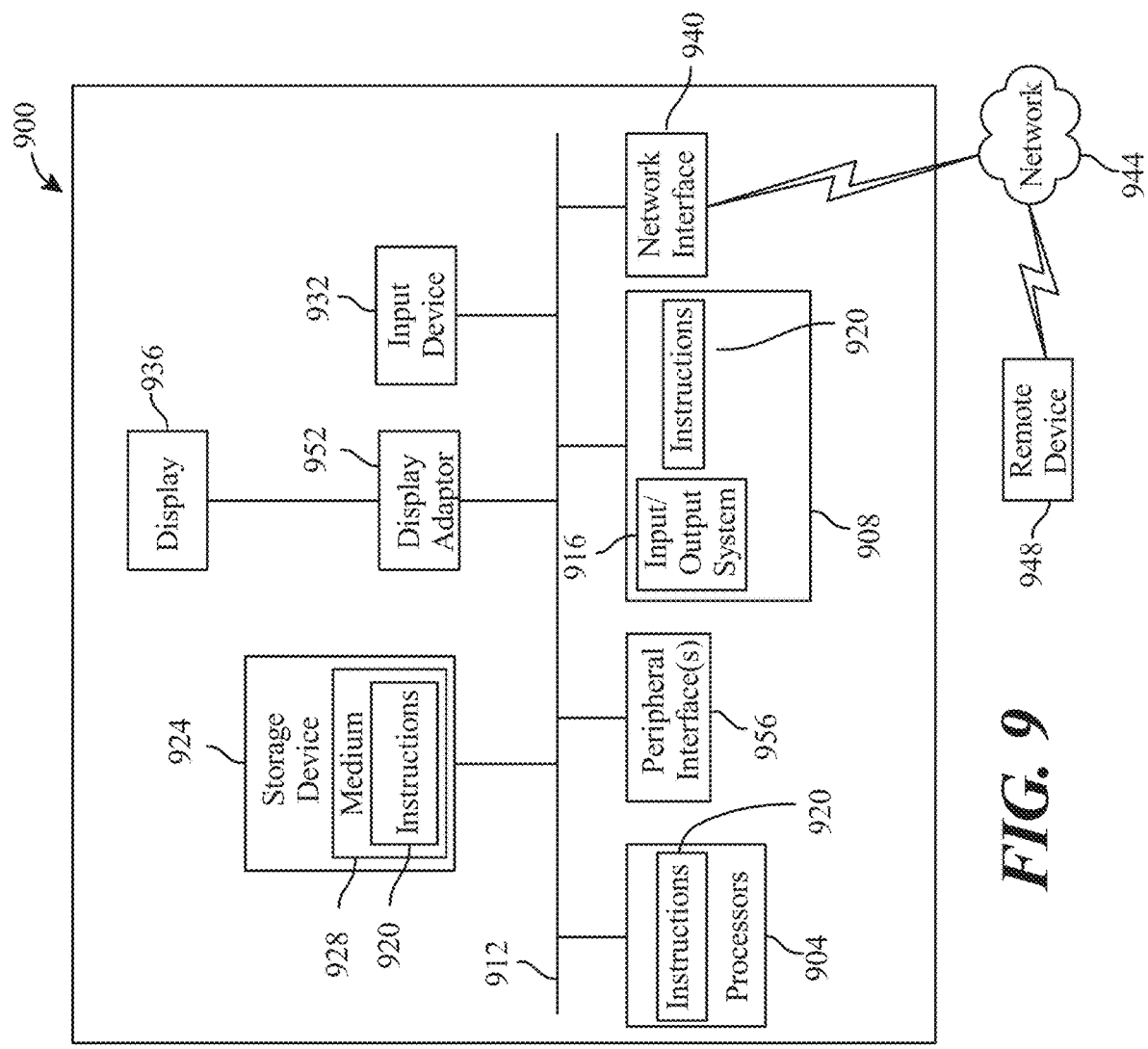
FIG. 9 is a block diagram of a computing system that can be used to implement any one or more of the methodologies disclosed herein and any one or more portions thereof.

FIG. 9 shows a diagrammatic representation of one embodiment of a computing device in the exemplary form of a computer system 900 within which a set of instructions for causing a control system to perform any one or more of the aspects and/or methodologies of the present disclosure may be executed. It is also contemplated that multiple computing devices may be utilized to implement a specially configured set of instructions for causing one or more of the devices to perform any one or more of the aspects and/or methodologies of the present disclosure. Computer system 900 includes a processor 904 and a memory 908 that communicate with each other, and with other components, via a bus 912. Bus 912 may include any of several types of bus structures including, but not limited to, a memory bus, a memory controller, a peripheral bus, a local bus, and any combinations thereof, using any of a variety of bus architectures.

Processor 904 may include any suitable processor, such as without limitation a processor incorporating logical circuitry for performing arithmetic and logical operations, such as an arithmetic and logic unit (ALU), which may be regulated with a state machine and directed by operational inputs from memory and/or sensors; processor 904 may be organized according to Von Neumann and/or Harvard architecture as a non-limiting example. Processor 904 may include, incorporate, and/or be incorporated in, without limitation, a microcontroller, microprocessor, digital signal processor (DSP), Field Programmable Gate Array (FPGA), Complex Programmable Logic Device (CPLD), Graphical Processing Unit (GPU), general purpose GPU, Tensor Processing Unit (TPU), analog or mixed signal processor, Trusted Platform Module (TPM), a floating-point unit (FPU), and/or system on a chip (SoC).

Memory 908 may include various components (e.g., machine-readable media) including, but not limited to, a random-access memory component, a read only component, and any combinations thereof. In one example, a basic input/output system 916 (BIOS), including basic routines that help to transfer information between elements within computer system 900, such as during start-up, may be stored in memory 908. Memory 908 may also include (e.g., stored on one or more machine-readable media) instructions (e.g., software) 920 embodying any one or more of the aspects and/or methodologies of the present disclosure. In another example, memory 908 may further include any number of program modules including, but not limited to, an operating system, one or more application programs, other program modules, program data, and any combinations thereof.

Computer system 900 may also include a storage device 924. Examples of a storage device (e.g., storage device 924) include, but are not limited to, a hard disk drive, a magnetic disk drive, an optical disc drive in combination with an optical medium, a solid-state memory device, and any combinations thereof. Storage device 924 may be connected to bus 912 by an appropriate interface (not shown). Example interfaces include, but are not limited to, SCSI, advanced technology attachment (ATA), serial ATA, universal serial bus (USB), IEEE 1394 (FIREWIRE), and any combinations thereof. In one example, storage device 924 (or one or more components thereof) may be removably interfaced with computer system 900 (e.g., via an external port connector (not shown)). Particularly, storage device 924 and an associated machine-readable medium 928 may provide nonvolatile and/or volatile storage of machine-readable instructions, data structures, program modules, and/or other data for computer system 900. In one example, software 920 may reside, completely or partially, within machine-readable medium 928. In another example, software 920 may reside, completely or partially, within processor 904.

Computer system 900 may also include an input device 932. In one example, a user of computer system 900 may enter commands and/or other information into computer system 900 via input device 932. Examples of an input device 932 include, but are not limited to, an alpha-numeric input device (e.g., a keyboard), a pointing device, a joystick, a gamepad, an audio input device (e.g., a microphone, a voice response system, etc.), a cursor control device (e.g., a mouse), a touchpad, an optical scanner, a video capture device (e.g., a still camera, a video camera), a touchscreen, and any combinations thereof. Input device 932 may be interfaced to bus 912 via any of a variety of interfaces (not shown) including, but not limited to, a serial interface, a parallel interface, a game port, a USB interface, a FIREWIRE interface, a direct interface to bus 912, and any combinations thereof. Input device 932 may include a touch screen interface that may be a part of or separate from display 936, discussed further below. Input device 932 may be utilized as a user selection device for selecting one or more graphical representations in a graphical interface as described above.

A user may also input commands and/or other information to computer system 900 via storage device 924 (e.g., a removable disk drive, a flash drive, etc.) and/or network interface device 940. A network interface device, such as network interface device 940, may be utilized for connecting computer system 900 to one or more of a variety of networks, such as network 944, and one or more remote devices 948 connected thereto. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network, such as network 944, may employ a wired and/or a wireless mode of communication. In general, any network topology may be used. Information (e.g., data, software 920, etc.) may be communicated to and/or from computer system 900 via network interface device 940.

Computer system 900 may further include a video display adapter 952 for communicating a displayable image to a display device, such as display device 936. Examples of a display device include, but are not limited to, a liquid crystal display (LCD), a cathode ray tube (CRT), a plasma display, a light emitting diode (LED) display, and any combinations thereof. Display adapter 952 and display device 936 may be utilized in combination with processor 904 to provide graphical representations of aspects of the present disclosure. In addition to a display device, computer system 900 may include one or more other peripheral output devices including, but not limited to, an audio speaker, a printer, and any combinations thereof. Such peripheral output devices may be connected to bus 912 via a peripheral interface 956. Examples of a peripheral interface include, but are not limited to, a serial port, a USB connection, a FIREWIRE connection, a parallel connection, and any combinations thereof.

The foregoing has been a detailed description of illustrative embodiments of the invention. Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments, what has been described herein is merely illustrative of the application of the principles of the present invention. Additionally, although particular methods herein may be illustrated and/or described as being performed in a specific order, the ordering is highly variable within ordinary skill to achieve methods, systems, and software according to the present disclosure. Accordingly, this description is meant to be taken only by way of example, and not to otherwise limit the scope of this invention.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A system comprising:
   at least a first inverter configured to:
      accept a direct current; and
      power a first motor;
   a first propulsor, wherein the first propulsor is configured to provide thrust;
   the first motor operatively connected with the first propulsor; and
   at least a monitoring circuit electrically connected with the direct current and configured to:
      detect a ground fault in the first motor or first inverter, wherein detecting the ground fault includes detecting a frequency in the direct current within a specified range; and
      control the direct current to the first inverter based on detecting the frequency within the specified range.

2. The system of claim 1, wherein the first inverter is further configured to switch the direct current internally to produce an alternating current.

3. The system of claim 2, wherein powering the first motor comprises powering the first motor using the alternating current.

4. The system of claim 1, wherein the monitoring circuit comprises an electromagnetic interference (EMI) filter.

5. The system of claim 4, wherein the monitoring circuit comprises at least a noise detection signal inductively connected with the EMI filter.

6. The system of claim 5, the system further comprising a computing device wherein the computing device is configured to selectively switch power to at least the first inverter based on detecting the frequency.

7. The system of claim 1, wherein the ground fault comprises a motor phase ground fault.

8. The system of claim 1, wherein the ground fault comprises a bus ground fault.

9. The system of claim 1, further comprising:
   at least a second inverter;
   a second motor powered by the second inverter; and
   a second propulsor operatively connected to the second motor and configured to provide thrust;
   wherein the frequency disturbs at least one of the second inverter, the second motor, and the second propulsor.

10. A method comprising:
   accepting, using at least a first inverter, a direct current;
   powering, using at least the first inverter, a first motor operatively connected with a first propulsor, wherein the first propulsor is configured to provide thrust;
   detecting, using at least a monitoring circuit electrically connected with the direct current, a ground fault in the first motor or first inverter, wherein detecting the ground fault includes detecting a frequency in the direct current within a specified range; and
   controlling, using at least the monitoring circuit, the direct current to the first inverter based on detecting the frequency within the specified range.

11. The method of claim 10, wherein powering, using at least the first inverter, the first motor operatively connected with the first propulsor, further comprises:
   receiving, by an energy source, the direct current;
   switching, using the first inverter, the direct current into an alternating current; and
   powering, using the first inverter, the first motor with the alternating current.

12. The method of claim 10, wherein the monitoring circuit comprises an electromagnetic interference (EMI) filter.

13. The method of claim 12, wherein the monitoring circuit comprises at least a noise detection signal inductively connected with the EMI filter.

14. The method of claim 12, wherein the frequency comprises a common mode noise, and wherein the EMI filter comprises a common mode filter.

15. The method of claim 12, wherein the frequency comprises a differential mode noise, and wherein the EMI filter comprises a differential mode filter.

16. The method of claim 10, wherein the ground fault comprises a motor phase ground fault.

17. The method of claim 10, wherein the ground fault comprises a bus ground fault.

18. The method of claim 17, further comprising:
   powering, using a second inverter, a second motor operatively connected with a second propulsor; and
   providing, using the second propulsor, thrust;
   wherein the frequency disturbs at least one of the second inverter, the second motor, and the second propulsor.

* * * * *